(12) United States Patent
Noda

(10) Patent No.: US 9,006,856 B2
(45) Date of Patent: Apr. 14, 2015

(54) THERMAL ELECTROMAGNETIC WAVE DETECTION ELEMENT, METHOD FOR PRODUCING THERMAL ELECTROMAGNETIC WAVE DETECTION ELEMENT, THERMAL ELECTROMAGNETIC WAVE DETECTION DEVICE, AND ELECTRONIC APPARATUS

(71) Applicant: Seiko Epson Corporation, Tokyo (JP)

(72) Inventor: Takafumi Noda, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 8 days.

(21) Appl. No.: 13/902,329

(22) Filed: May 24, 2013

(65) Prior Publication Data
US 2013/0313674 A1 Nov. 28, 2013

(30) Foreign Application Priority Data
May 25, 2012 (JP) ................................. 2012-119424

(51) Int. Cl.
*H01L 31/058* (2006.01)
*H01L 31/0224* (2006.01)
(Continued)

(52) U.S. Cl.
CPC ............ *H01L 31/0224* (2013.01); *H01L 31/18* (2013.01); *G01J 5/02* (2013.01);
(Continued)

(58) Field of Classification Search
CPC ....... H01L 33/50; H01L 33/502; H01L 27/14; H01L 2933/0041; H01L 33/10; H01L 27/14625; H01L 23/66; H01L 31/0747; A61B 18/18
USPC ................... 257/467, 295, E43.001–E43.007, 257/E27.005–E27.006, E27.008, E29.164, 257/E29.167, E29.272, E29.323, 257/E21.663–E21.665, 296–313, 535, 257/595–602, 923–924, E27.016–E27.017, 257/E27.019–E27.021, E27.023–E27.025, 257/E27.03–E27.035, E27.037–E27.038, 257/E27.041–E27.045, E27.047–E27.048, 257/E27.071, E27.09, E27.092–E27.093, 257/E27.095, E27.101, E27.114–E27.116, 257/751, 774, 762, 200, 758; 374/120, 121, 374/208; 438/171, 190, 210, 238–253, 329, 438/379, 378, 444, 901, 3, 785, E21.208
See application file for complete search history.

(56) References Cited

U.S. PATENT DOCUMENTS

| | | | |
|---|---|---|---|
| 2011/0182320 A1* | 7/2011 | Noda | ............................. 374/121 |
| 2011/0233710 A1 | 9/2011 | Noda et al. | |
| 2012/0217400 A1* | 8/2012 | Noda | ......................... 250/338.3 |

FOREIGN PATENT DOCUMENTS

JP 2011-203167 A 10/2011

*Primary Examiner* — Dao H Nguyen
*Assistant Examiner* — Tram H Nguyen
(74) *Attorney, Agent, or Firm* — Global IP Counselors, LLP

(57) ABSTRACT

To provide a thermal electromagnetic wave detection element, a method for producing a thermal electromagnetic wave detection element, a thermal electromagnetic wave detection device, and an electrical apparatus, which are highly reliable and make it possible to prevent damage or deformation in the vicinity of the corner parts of a void, a thermal electromagnetic wave detection element includes: a semiconductor substrate; a support member provided on the semiconductor substrate; a detection unit that is provided on the support member and is able to extract from a pair of electrodes an electrical signal corresponding to a received amount of electromagnetic waves; and a pair of electrically conductive vias that perforate through the semiconductor substrate and are electrically connected to the pair of electrodes, a void that opens on the support member side being provided between the pair of vias of the semiconductor substrate.

20 Claims, 15 Drawing Sheets

(51) Int. Cl.
*H01L 31/18* (2006.01)
*G01J 5/02* (2006.01)
*G01J 5/34* (2006.01)
*G01J 5/08* (2006.01)

(52) U.S. Cl.
CPC .............. *G01J 5/0225* (2013.01); *G01J 5/024* (2013.01); *G01J 5/025* (2013.01); *G01J 5/0837* (2013.01); *G01J 5/34* (2013.01); *G01J 2005/345* (2013.01); *G01J 5/0853* (2013.01)

THERMAL ELECTROMAGNETIC WAVE DETECTION ELEMENT, METHOD FOR PRODUCING THERMAL ELECTROMAGNETIC WAVE DETECTION ELEMENT, THERMAL ELECTROMAGNETIC WAVE DETECTION DEVICE, AND ELECTRONIC APPARATUS

CROSS-REFERENCE TO RELATED APPLICATIONS

This application claims priority to Japanese Patent Application No. 2012-119424 filed on May 25, 2012. The entire disclosure of Japanese Patent Application No. 2012-119424 is hereby incorporated herein by reference.

BACKGROUND

1. Technical Field

The present invention relates to a thermal electromagnetic wave detection element, a method for producing a thermal electromagnetic wave detection element, a thermal electromagnetic wave detection device, and an electronic apparatus.

2. Related Art

Well-known thermal electromagnetic wave detection devices include pyroelectric-type, thermocouple-type, and resistance-type (bolometer-type) infrared ray detection devices, among others. In particular, a pyroelectric infrared ray detection device makes use of the fact that the amount of spontaneous polarization in a pyroelectric material changes depending on the amount of light from received infrared rays; for example, in the case of reading out with a source follower circuit, an electrical potential difference arising due to a pyroelectric current is created at both ends of a pyroelectric body, and this electrical potential difference is utilized to detect infrared rays. The pyroelectric infrared ray detection device of such description has the advantage of being superior, in terms of detection sensitivity, to other infrared ray detection devices, such as of a thermocouple-type or bolometer-type.

One known pyroelectric infrared ray detection element is, for example, an element described in Japanese Laid-open Patent Publication 2011-203167. The infrared ray detection element (pyroelectric infrared ray detector) described in Japanese Laid-open Patent Publication 2011-203167 includes a substrate, an interlayer insulating layer provided on the substrate, a support substrate provided on the interlayer insulating layer, a detection unit that is provided on the support substrate and receives infrared rays, and one pair of electrically conductive vias (columnar electrodes) that are electrically connected to one pair of electrodes of the detection unit. A void is also formed at a site below the detection units in the interlayer insulating layer, thereby achieving thermal isolation between the detection unit and the substrate. Each of the vias is positioned lower than the void, with one of the vias being arranged so as to overlap with the void as seen in plan view.

However, in the infrared ray detection element described in Japanese Laid-open Patent Publication 2011-203167, because the via is arranged so as to overlap with the void as seen in plan view, stress is concentrated on corner parts of the void in the interlayer insulating layer at such times as when the void is being formed in the interlayer insulating layer, and a concern emerges in that the interlayer insulating layer can be damaged or deformed in the vicinity of the corner parts of the void.

SUMMARY

An advantage of the invention is to provide a thermal electromagnetic wave detection element, a method for producing a thermal electromagnetic wave detection element, a thermal electromagnetic wave detection device, and an electrical apparatus, which are highly reliable and make it possible to prevent damage or deformation in the vicinity of the corner parts of the void.

Such an advantage is achieved by the invention described below. The thermal electromagnetic wave detection element of the invention is characterized by including: a semiconductor substrate;

a support member provided on the semiconductor substrate;

a detection unit that is provided on the support member and is able to extract from a pair of electrodes an electrical signal corresponding to a received amount of electromagnetic waves; and a pair of electrically conductive vias that perforate through the semiconductor substrate and are electrically connected to the pair of electrodes;

a void that opens on the support member side being provided between the pair of vias of the semiconductor substrate.

This makes it possible to prevent stress from being concentrated at the corners of the void in the semiconductor substrate, and makes it possible to prevent the semiconductor substrate and the like from being damaged or deformed in the vicinity of the corners of the void, thereby making it possible to provide a highly reliable thermal electromagnetic wave detection element. Further, because the void is provided in the semiconductor substrate, there is no need to use a sacrificial layer made of a resin having low heat resistance in the formation of the void, and this allows for the temperature in the course of forming the detection unit to be at a temperature sufficient for the formation of the detection unit without any problems arising, thereby making it possible to form a high-performance detection unit.

In the thermal electromagnetic wave detection element of the invention, preferably, the void and a surface of the pair of vias on the support member side do not overlap when seen in plan view. This makes it possible to more reliably prevent damage or deformation of the semiconductor substrate or the like in the vicinity of the corners of the void. In the thermal electromagnetic wave detection element of the invention, preferably, the void is formed by subjecting the semiconductor substrate to an etching process. This makes it possible for the void to be readily and reliably formed.

In the thermal electromagnetic wave detection element of the invention, preferably, the etching rate of a constituent material of the semiconductor substrate in the etching process is higher than the etching rate of a constituent material of the support member. This obviates the need to form a protective layer aimed at protecting the detection unit and the support member in the course of subjecting the semiconductor substrate to the etching process and forming the void, and thereby makes it possible to lower the thermal conductivity by an amount commensurate with the protective layer. This makes it possible to curb the transfer of the heat of the detection unit to the vias or to the semiconductor substrate. For this reason, electromagnetic waves can be more efficiently detected with the detection unit.

In the thermal electromagnetic wave detection element of the invention, preferably, each of the surfaces of the pair of vias on the support member side is positioned on a surface of the support member on the semiconductor substrate side. This makes it possible to reduce the surface area of mutual contact when the pair of vias are electrically connected to a pair of electrode wirings for electrically connecting the pair of electrodes and the pair of vias, and thereby makes it possible to curb the transfer of the heat of the detection unit to the vias through the electrode wirings. For this reason, electromagnetic waves can be more efficiently detected with the detection unit.

In the thermal electromagnetic wave detection element of the invention, preferably, the detection unit has a pair of electrode wirings for electrically connecting together the pair of electrodes and the pair of vias, and the pair of electrode wirings each perforate through the support member and are electrically connected to the pair of vias.

This makes it possible to reduce the surface area of mutual contact when the pair of vias are electrically connected to the pair of electrode wirings, and thereby makes it possible to curb the transfer of the heat of the detection unit to the vias through the electrode wirings. For this reason, electromagnetic waves can be more efficiently detected with the detection unit.

In the thermal electromagnetic wave detection element of the invention, preferably, the pair of vias are each provided perforating through the support member. This makes it possible for the thermal electromagnetic wave detection element to be more readily produced in comparison to a case where the pair of vias do not perforate through the support member. In the thermal electromagnetic wave detection element of the invention, preferably, the transverse cross-sectional surface areas of the pair of vias gradually decrease going toward the support member side. This makes it possible to reduce the surface area of contact between the vias and the detection unit, and makes it possible to curve heat transfer from the detection unit to the vias. For this reason, the detection unit can more efficiently detect electromagnetic waves.

A method for producing a thermal electromagnetic wave detection device in the invention is characterized by including: a step for obtaining a laminate including a semiconductor substrate, a support member provided on the semiconductor substrate, and a detection unit that is provided on the support member and is able to extract from a pair of electrodes an electrical signal corresponding to a received amount of electromagnetic waves;

a step for forming a pair of electrically conductive vias that perforate through the semiconductor substrate and are electrically connected to the pair of electrodes; and a step for subjecting the semiconductor substrate to an etching process and forming a void that opens on the support member side between the pair of vias of the semiconductor substrate.

According to the method of production of such description, it is possible to prevent stress from being concentrated at the corners of the void within the semiconductor substrate, possible to prevent damage to or deformation of the semiconductor substrate or the like in the vicinity of the corners of the void, and possible to readily produce a highly reliable thermal electromagnetic wave detection element. Further, because the void is formed in the semiconductor substrate, there is no need to use a sacrificial layer made of a resin having low heat resistance, and this allows for the temperature in the course of forming the detection unit to be at a temperature sufficient for the formation of the detection unit without any problems arising, thereby making it possible to form a high-performance detection unit.

A method for producing a thermal electromagnetic wave detection device in the invention is characterized by including: a step for obtaining a laminate having a semiconductor substrate and a support member provided on the semiconductor substrate;

a step for forming a pair of electrically conductive vias that perforate through the semiconductor substrate;

a step for forming, on the support member, a detection unit that has a pair of electrodes electrically connected to the pair of vias and is able to extract from the pair of electrodes an electrical signal corresponding to a received amount of electromagnetic waves; and a step for subjecting the semiconductor substrate to an etching process and forming a void that opens on the support member side between the pair of vias of the semiconductor substrate.

According to the method of production of such description, it is possible to prevent stress from being concentrated at the corners of the void within the semiconductor substrate, possible to prevent damage to or deformation of the semiconductor substrate or the like in the vicinity of the corners of the void, and possible to readily produce a highly reliable thermal electromagnetic wave detection element. Further, because the void is formed in the semiconductor substrate, there is no need to use a sacrificial layer made of a resin having low heat resistance, and this allows for the temperature in the course of forming the detection unit to be at a temperature sufficient for the formation of the detection unit without any problems arising, thereby making it possible to form a high-performance detection unit.

A thermal electromagnetic wave detection device of the invention is characterized in that a plurality of the thermal electromagnetic wave detection elements of the invention are arranged two-dimensionally. A thermal electromagnetic wave detection device that is able to bring about the effects described above is thereby obtained. An electronic apparatus of the invention is characterized by being provided with at least one of the thermal electromagnetic wave detection element of the invention. An electronic apparatus that is able to bring about the effects described above is thereby obtained. In the electronic apparatus of the invention, preferably, the electronic apparatus is an image-capturing device provided with a thermal electromagnetic wave detection device in which a plurality of the thermal electromagnetic wave detection elements are arranged two-dimensionally. This makes it possible for the electronic apparatus to be used, for example, as an infrared camera, in thermography, in vehicle-mounted night vision, or as a monitoring camera.

BRIEF DESCRIPTION OF THE DRAWINGS

Referring now to the attached drawings which form a part of this original disclosure.

DETAILED DESCRIPTION OF EXEMPLARY EMBODIMENTS

The following describes preferred embodiments of a thermal electromagnetic wave detection element, a method for producing a thermal electromagnetic wave detection element, a thermal electromagnetic wave detection device, and an electronic apparatus of the invention, with reference to the accompanying drawings.

First Embodiment

Figure 1:
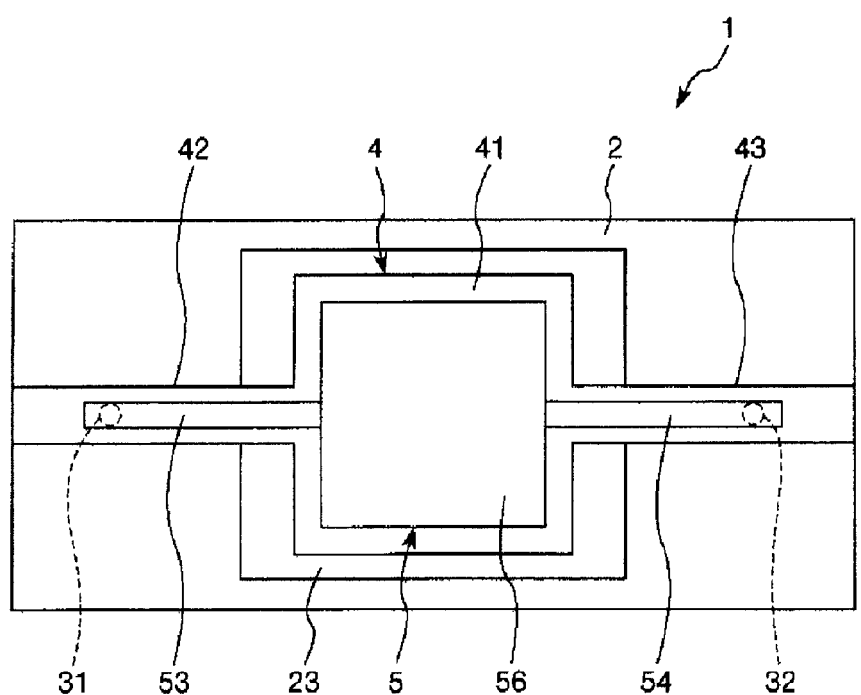
FIG. 1 is a plan view illustrating a thermal electromagnetic wave detection element as in a first embodiment of the invention.
Figure 2:
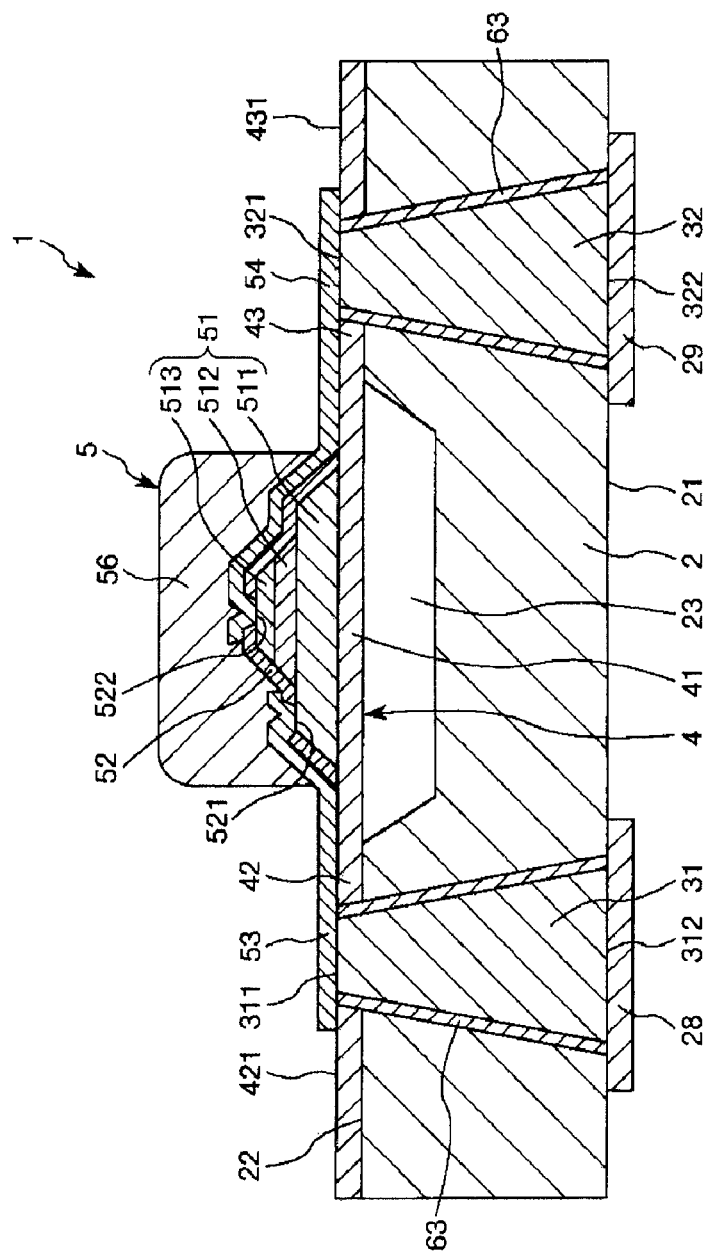
FIG. 2 is a cross-sectional view of the thermal electromagnetic wave detection element illustrated in FIG. 1.

First, the description shall relate to a first embodiment of a thermal electromagnetic wave detection element of the invention. FIG. 1 is a plan view illustrating a thermal electromagnetic wave detection element as in the first embodiment of the invention; FIG. 2 is a cross-sectional view of the thermal electromagnetic wave detection element illustrated in FIG. 1; and FIGS. 3 to 6 are cross-sectional views for describing a method for producing a thermal electromagnetic wave detection element illustrated in FIG. 1. Hereinbelow, for the sake of convenience of description, the upper side in FIGS. 2 to 6 is called "above", "up", or "upper"; the lower side is called "below", "down", or "lower"; the right side is called "right"; and the left side is called "left".

1. Thermal Electromagnetic Wave Detection Element

The thermal electromagnetic wave detection element 1 illustrated in FIGS. 1 and 2 is a pyroelectric detection element for detecting electromagnetic waves. Electromagnetic waves encompass, for example, radio waves, infrared rays, visible light rays, ultraviolet rays, infrared rays, X-rays, and gamma rays, but the following description relates primarily to a pyroelectric infrared ray detection element for detecting infrared rays (light having a wavelength of about 0.7 to 1,000 µm), by way of representative example. A configuration similar to that of the thermal electromagnetic wave detection element 1 could also be adopted for a case where electromagnetic waves other than infrared waves, such as radio waves, visible light rays, infrared rays, X-rays, or gamma rays, are to be detected.

The thermal electromagnetic wave detection element 1 of such description includes a semiconductor substrate (hereinafter, "substrate") 2, a membrane (support member) 4 provided on the substrate 2, a detection unit 5 provided on the membrane 4, and one pair of vias (columnar electrodes) 31, 32 formed on the substrate 2. The vias 31, 32 perforate through the substrate 2 in a thickness direction thereof; a void (space) 23 opening towards the membrane 4 side is provided between the via 31 and the via 32 of the substrate 2. The void 23 thermally isolates the detection unit 5 and the substrate 2 from each other.

1-1. Substrate

The substrate 2 has the function of supporting the membrane 4. Provided that the constituent material of the substrate 2 is a semiconductor material, there is no particular limitation thereto; for example, Si (silicon), GaAs, or the like could be used. Herein, preferably, the void 23 (more detailed description to follow) is formed by subjecting the substrate 2 to an etching process. This makes it possible for the void 23 to be readily and reliably formed. In a case where the void 23 is formed by an etching process, the constituent material of the substrate 2 and the constituent material of the membrane 4 are each selected so that the etching rate of the constituent material of the substrate 2 in the etching process will be higher than the etching rate of the constituent material of the membrane 4.

This obviates the need to form a protective layer aimed at protecting the detection unit 5 and the membrane 4 in the course of subjecting the substrate 2 to the etching process and forming the void 23, and thereby makes it possible to lower the thermal conductivity by an amount commensurate with the protective layer. This makes it possible to curb the transfer of the heat of the detection unit 5 to the vias 31, 32 or to the substrate 2. For this reason, infrared rays can be more efficiently detected with the detection unit 5.

Also, in the formation of the void 23, there is no need to use a sacrificial layer made of a resin having low heat resistance, and this allows for the temperature in the course of forming the detection unit 5 to be at a temperature sufficient for the formation of the detection unit 5 without any problems arising, thereby making it possible to form a high-performance detection unit 5. Where (a) is the etching rate of the constituent material of the substrate 2 in the etching processing and (b) is the etching rate of the constituent material of the membrane 4, a ratio (selection ratio) a/b for the etching rates is preferably 10 or greater, more preferably 10 to 100, even more preferably 20 to 100.

The substrate 2 can be constituted of a single layer, or can be constituted of a laminate obtained when a plurality of layers are laminated together. Though not particularly limited, the thickness of the substrate 2 could be, for example, about 10 to 800 µm. As illustrated in FIG. 2, two external connection terminals 28, 29 are formed on a lower surface 21 of the substrate 2 of such description. These two external connection terminals 28, 29 are electrically connected to the detection unit 5, as shall be described below.

The void 23, which opens on the membrane 4 side, is formed between the via 31 and the via 32 (description to follow) of the substrate 2. The side of the void 23 opposite to the membrane 4 is, in the present embodiment, closed off. The void 23 is formed so as to encompass a capacitor 51 of the detection unit 5 as seen in plan view. This makes it possible for the void 23 to thermally isolate the detection unit 5 and the substrate 2, in particular the capacitor 51 and the substrate 2, from each other.

The void 23 is formed so as not to overlap with upper surfaces (top surfaces) 311, 321 of the vias 31, 32, i.e., with the surfaces of the vias 31, 32 that are on the membrane 4 side, as seen in plan view. The void 23 is also formed so as not to overlap with lower surfaces 312, 322 of the vias 31, 32, i.e., with the surfaces of the vias 31, 32 on the side opposite to the membrane 4. This makes it possible to prevent stress from being concentrated at the corners of the void 23 in the substrate 2, and makes it possible to prevent the substrate 2 and the like from being damaged or deformed in the vicinity of the corners of the void 23, thereby making it possible to provide a highly reliable thermal electromagnetic wave detection element 1.

Herein, the thermal electromagnetic wave detection element 1 can be accommodated within a hermetically sealed package (not shown). In such a case, the inside of the package, i.e., the void 23 can be made into a depressurized (preferably, vacuum) environment or can be made into an inert gas-filled environment. This makes it possible to effectively thermally isolate the detection unit 5 and the substrate 2 from each other in comparison to a case where, for example, the thermal electromagnetic wave detection element 1 is arranged in open air.

Though not particularly limited, the height (thickness) of the void 23 is, for example, preferably about 1 to 100 μm, more preferably about 1 to 20 μm. This makes it possible to effectively thermally isolate the substrate 2 and the detection unit 5 onto which the membrane 4 is mounted from each other, while also achieving a thinner substrate 2, i.e., achieving a smaller scale for the thermal electromagnetic wave detection element 1. When the height of the void 23 is greater than 10 to 20 μm, the height of the void 23 reaches a height sufficient for thermally isolating the detection unit 5 and the substrate 2 from each other. For this reason, in a case where, for example, the thermal electromagnetic wave detection element 1 is accommodated within the package by setting the height of the void 23 to 10 to 20 μm or more, then the detection unit 5 and the substrate 2 can be sufficiently thermally isolated from each other even without increasing the degree of vacuum in the void 23 (the degree of vacuum within the package), and it becomes easier to produce same.

As illustrated in FIG. 2, the void 23 is of uniform thickness, except for an end part thereof. In other words, the thickness of the void 23 is substantially the same except for the end part thereof. Having the thickness of the void 23 be uniform in this manner makes it possible to bring out an effect of thermal isolation that is uniform at each of the parts of the void 23, and thus enhances reliability. It is also easier to form the thermal isolation void 23. The void 23 can be of uniform thickness in all regions, or can include places where the thickness changes partially elsewhere other than the end part.

1-2. Membrane

As illustrated in FIGS. 1 and 2, the membrane 4 forms a plate shape, and includes a planar mounting part 41 for mounting and supporting the detection unit 5, and two arms 42, 43 which extend from the edge of the mounting part 41 toward both sides. The membrane 4 of such description is supported on the substrate 2 by the two arms 42, 43. The mounting part 41 and the arms 42, 43 can, for example, be formed integrally by patterning a single member by etching or the like.

The shape of the mounting part 41 as seen in plan view is substantially quadrangular (substantially square). The size of the mounting part 41 is not particularly limited, but preferably, for example, the length of one size is about 20 to 50 μm. The shape of the mounting part 41 as seen in plan view is not particularly limited and can be, for example, a circle, an ellipse, a rectangle, a triangle, a pentagon, or the like. The arm 42 is connected at the distal end thereof to the mounting part 41, and is supported by the substrate 2. Similarly, the arm 43 is connected at the distal end thereof to the mounting part 41, and is supported by the substrate 2. The arms 42, 43 are greater in length and shorter in width, and form a rectilinear shape that extends in one direction (a predetermined direction). The two arms 42, 43 are formed in point symmetry with respect to the center of the mounting part 41.

Endowing the arms 42, 43 with the shape of such description amply lowers the thermal conductance of the arms 42, 43 in comparison to the mounting part 41. More specifically, causing the surface area of the transverse cross-section of the arms 42, 43 (the surface orthogonal to the direction in which heat is conducted) to be amply less than the surface area of the transverse cross-section of the mounting part 41 makes it possible to cause the arms 42, 43 to less readily transfer heat in comparison to the mounting part 41. For this reason, the heat of the detection unit 5 is less readily transferred to the substrate 2 via the arms 42, 43, and the detection unit 5 can be effectively thermally isolated with respect to the substrate 2; therefore, the sensitivity of the detection unit 5 is enhanced.

Though not particularly limited, the length of the arms 42, 43 is preferably, for example, about 20 to 50 μm. Though also not particularly limited, the width of the arms 42, 43 is preferably, for example, about 1 to 10 μm. Further, though not particularly limited, the thickness of the arms 42, 43 is, for example, about 1 to 10 μm. Endowing the arms 42, 43 with the length, width, and thickness of such description makes it possible to more effectively bring about the effects described above, and also makes it possible to achieve a smaller scale for the thermal electromagnetic wave detection element 1. Furthermore, deflection of the arms 42, 43 can be curbed; also, unintended changes of posture (vibration, swinging, and the like) of the detection unit 5 mounted onto the mounting part 41 can be curbed. This endows the thermal electromagnetic wave detection element 1 with a smaller scale and excellent reliability.

Though not particularly limited, it would be possible to use, for example, Al2O3, a silicon oxide such as SiO2 or Si2O3, a silicon nitride such as Si3N4, polysilicon, amorphous silicon, or the like as the constituent material of the membrane 4. Constituting the membrane 4 of such a constituent material makes it possible to impart insulation properties to the membrane 4. It is also possible to lower the heat capacity of the membrane 4, and possible to effectively thermally isolate the detection unit 5 with respect to the substrate 2. The membrane 4 can be constituted of a single layer, or can be constituted of a laminate obtained when a plurality of layers are laminated. In a case where [the membrane 4] is constituted of a laminate, then the membrane 4 can be constituted of a laminate obtained when, for example, an Si3N4 film (a silicon nitride film), an SiO2 film (silicon oxide film), and an Si3N4 film (a silicon nitride film) are laminated in the stated order.

1-3. Detection Unit

The detection unit 5 has the function of detecting infrared rays (light having a wavelength of about 0.7 to 1,000 μm). As illustrated in FIG. 2, the detection unit 5 includes a capacitor 51 constituted of a lower electrode 511 formed on an upper surface of the mounting part 41 of the membrane 4, a pyroelectric layer 512 formed with overlap on the lower electrode 511, and an upper electrode 513 formed with overlap on the pyroelectric layer 512.

When the detection unit 5 is irradiated with infrared rays (or light that includes infrared rays) and the pyroelectric layer 512 absorbs the infrared rays and is heated, the magnitude of polarization of the pyroelectric layer 512 changes depending on a change in temperature thereof. For this reason, a temperature change in the pyroelectric layer 512 can be extracted as a voltage (electrical signal) from between the lower electrode 511 and the upper electrode 513. It is then possible to detect the temperature of the pyroelectric layer 512 from the magnitude of the extracted voltage, and furthermore possible to detect the irradiated amount of infrared rays with which the detection unit 5 has been irradiated from the extracted temperature of the pyroelectric layer 512.

The pyroelectric layer 512 is constituted of a pyroelectric body. Though not particularly limited, it would be possible to use, for example, PZT (lead zirconate titanate), PTZN (PZT to which Nb (niobium) has been added), PLZT (lead lanthanum zirconate titanate), SBT (strontium barium titanate), LiTaO3, PbTiO3, PbLaO3, or the like as the pyroelectric body constituting the pyroelectric layer 512. Though not particularly limited, the thickness of the pyroelectric layer 512 can be, for example, about 0.05 to 0.2 µm.

Provided that the constituent materials of the lower electrode 511 and the upper electrode 513 have the necessary electrical conductivity, there is no particular limitation thereto, and it would be possible to use, for example, a metal material such as Au, Ag, Pt, Cu, Al, Fe, Ni, Cr, Ir, Ta, or an alloy containing at least one of these species. It is particularly preferable to use those materials among the materials listed above that have high heat resistance as the constituent material of the lower electrode 511 and the upper electrode 513, examples of which include Au, Pt, and Ir.

The lower electrode 511 (and the same also applies to the upper electrode 513) can be a single-layered structure including a single layer, or can be a laminate structure obtained when a plurality of layers are laminated. In a case where the lower electrode 511 is given a laminate structure, then the structure could be one where, for example, a base layer constituted of Ir and an electrode layer constituted of Pt are laminated together; an interlayer constituted of, for example IrOx (iridium oxide) can also be interposed between the base layer and the electrode layer. Examples of other configurations could include a structure obtained when, for example, a base layer constituted of an Ni—Cr-based alloy and an electrode layer constituted of Au or an Au-based alloy are laminated together. Though not particularly limited, the thickness of the lower electrode 511 and the upper electrode 513 could be, for example, about 0.3 to 0.6 µm.

As illustrated in FIG. 2, the detection unit 5 further includes: an insulating film 52 that covers the capacitor 51; a lower electrode wiring 53 that is electrically connected to the lower electrode 511 and is drawn out as far as the distal end of the arm 42; an upper electrode wiring 54 that is electrically connected to the upper electrode 513 and is drawn out as far as the distal end of the arm 43; an insulating film 55 that covers the capacitor 51, the lower electrode wiring 53, and the upper electrode wiring 54; and an infrared ray absorption film 56 that is formed with overlap with the capacitor 51.

The insulating film 52 covers the capacitor 51. This makes it possible to both protect the capacitor 51 and prevent an unintended electrical connection (short circuit) between the capacitor 51 and a wiring or the like. Also formed on the insulating film 52 are a first contact hole 521 that leads to the lower electrode 511 and a second contact hole 522 that leads to the upper electrode 513.

Provided that the constituent material of the insulating film 52 have the necessary insulation performance, there is no particular limitation thereto, and it would be possible to use, for example, Al2O3, a silicon oxide such as SiO2 or Si2O3, a silicon nitride such as Si3N4, or the like. The insulating film 52 can be a single-layered structure constituted of a single layer, or can be a laminate structure obtained when a plurality of layers are laminated together. In a case where the insulating film 52 is given a laminate structure, then the structure could be one where, for example, a first layer constituted of Al2O3 and a second layer constituted of SiO2 or Si3N4 are laminated together.

The lower electrode wiring 53 is formed straddling the membrane 4 and the insulating film 52 of such description. The lower electrode wiring 53 leads at one end thereof to the first contact hole 521 and is electrically connected to the lower electrode 511. The other end of the lower electrode wiring 53 is positioned on the arm 42. The lower electrode 511 is drawn out by the lower electrode wiring 53 of such description onto the arm 42.

The upper electrode wiring 54 is formed straddling the membrane 4 and the insulating film 52. The upper electrode wiring 54 leads at one end thereof to the second contact hole 522 and is electrically connected to the upper electrode 513. The other end of the upper electrode wiring 54 is positioned on the arm 43. The upper electrode 513 is drawn out by the upper electrode wiring 54 of such description onto the arm 43.

Provided that the constituent materials of the lower electrode wiring 53 and the upper electrode wiring 54 of such description have the necessary electrical conductivity, there is no particular limitation thereto, and it would be possible to use, for example, a metal material such as Au, Ag, Pt, Cu, Al, Fe, Ni, Cr, Ir, or Ta, or an alloy containing at least one of these species. It is particularly preferable to use those materials among the materials listed above that have high heat resistance as the constituent materials of the lower electrode wiring 53 and the upper electrode wiring 54, examples of which include ones similar to those of the lower electrode 511 and the upper electrode 513 stated above.

The infrared ray absorption film 56 is formed with overlap with the capacitor 51. The nature of the infrared ray absorption film 56 is such that the infrared ray absorption film 56 absorbs infrared rays substantially without reflecting same. Forming the infrared ray absorption film 56 of such description with overlap onto the capacitor 51 makes it possible to efficiently absorb the infrared rays with which the detection unit 5 is irradiated, and therefore makes it possible to increase the change amount in the temperature of the pyroelectric layer 512 and makes it possible to raise the sensitivity of the detection unit 5. Provided that the constituent material of the infrared ray absorption film 56 be a material that has a high absorptivity to infrared rays, there is no particular limitation thereto, and it would be possible to use, for example, Si, SiO2, Si3N4, a Ti—N-based alloy, an Ni—Cr-based alloy, C, gold black, polyimide, or the like. The foregoing description relates to the detection unit 5.

1-4. Vias

The vias 31, 32 are electrically conductive, and have the function of electrically connecting the lower electrode wiring 53 and the external connection terminal 28, as well of electrically connecting the upper electrode wiring 54 and the external connection terminal 29. As illustrated in FIG. 1, the via 31 is provided perforating through the substrate 2 and the arm 42 of the membrane 4, and the upper surface (top surface) 311 thereof is matched to an upper surface 421 of the arm 42 and is in contact with the lower electrode wiring 53. The via 31 and the lower electrode wiring 53 are thereby electrically connected to each other. Providing the via 31 so as to perforate through the membrane 4 makes it possible to simply and reliably create conduction with the lower electrode wiring 53 formed on the upper surface of the membrane 4.

The lower surface 312 of the via 31 faces the lower surface 21 of the substrate 2, and also is matched to the lower surface 21 of the substrate 2 and is in contact with the external connection terminal 28, which is formed on the lower surface 21 of the substrate 2. The via 31 and the external connection terminal 28 are thereby electrically connected to each other. In this manner, in the thermal electromagnetic wave detection element 1, the lower electrode wiring 53 (the lower electrode 511) and the external connection terminal 28 are electrically connected to each other via the via Similarly, the via 32 is provided perforating through the substrate 2 and the arm 43 of the membrane 4, and the upper surface (top surface) 321 thereof is matched to an upper surface 431 of the arm 43 and is in contact with the upper electrode wiring 54. The via 32 and the upper electrode wiring 54 are thereby electrically connected to each other. Providing the via 32 so as to perforate through the membrane 4 makes it possible to simply and reliably create conduction with the upper electrode wiring 54 formed on the upper surface of the membrane 4.

The lower surface 322 of the via 32 faces the lower surface 21 of the substrate 2, and also is matched to the lower surface 21 of the substrate 2 and is in contact with the external connection terminal 29, which is formed on the lower surface 21 of the substrate 2. The via 32 and the external connection terminal 29 are thereby electrically connected to each other. In this manner, in the thermal electromagnetic wave detection element 1, the upper electrode wiring 54 (the upper electrode 513) and the external connection terminal 29 are electrically connected to each other via the via 32.

The vias 31, 32 substantially form a truncated cone shape. For this reason, the transverse cross-sectional surface area of the vias 31, 32 gradually reduces going towards the membrane 4 side, i.e., going towards the upper surfaces 311, 321 from the lower surfaces 312, 322. Endowing the vias 31, 32 with the shape of such description makes it possible to reduce the surface areas of the upper surfaces 311, 321 of the vias 31, 32 while also ensuring the mechanical strength of the vias 31, 32. For this reason, it is possible to reduce the surface area of contact between the via 31 and the lower electrode wiring 53, and the surface area of contact between the via 32 and the upper electrode wiring 54; it is also possible to curb the transfer of the heat of the detection unit 5 to the vias 31, 32 and to the substrate 2 via the lower electrode wiring 53 and the upper electrode wiring 54. That is, the detection unit 5 can be more effectively thermally isolated with respect to the substrate 2.

Though not particularly limited, the surface area of contact between the via 31 and the lower electrode wiring 53 (the surface area of contact between the via 32 and the upper electrode wiring 54) is preferably about 0.1 to 1 μm2. This makes it possible to more reliably electrically connect the via 31 and the lower electrode wiring 53 to each other, and also to more effectively thermally isolate the detection unit 5. Though not particularly limited, the shape of the vias 31, 32 can be, for example, triangular prismoid, quadrangular prismoid, or the like, or can be a columnar shape such as a cylindrical column, a triangular prism, or a quadrangular prism. The vias 31, 32 are also not limited to being solid, and can instead be hollow.

Provided that the constituent materials of the vias 31, 32 of such description have the necessary electrical conductivity, there is no particular limitation thereto, and it would be possible to use, for example, a metal material such as Au, Ag, Pt, Cu, Al, Fe, Ni, Cr, Co, Ir, or Ta, or an alloy containing at least one of these species. The vias 31, 32 of such description are covered with an insulating film 63. The insulating film 63 has the function of insulating the vias 31, 32 and the substrate 2 from each other.

Provided that the constituent material of the insulating film 63 have the necessary insulating performance, there is no particular limitation thereto, and it would be possible to use, for example, Al2O3, a silicon oxide such as SiO2 or Si2O3, a silicon nitride such as Si3N4, or the like. The insulating film 63 can be a single-layered structure including a single layer, or can be a laminate structure obtained when a plurality of layers are laminated together. In a case where the insulating film 63 is given a laminate structure, the structure could be one where, for example, a first layer constituted of Al2O3 and a second layer constituted of SiO2 or Si3N4 are laminated together.

Though not particularly limited, the thickness of the insulating film 63 could be, for example, about 0.1 to 1 μm. In the present embodiment, there is a pair of vias that is formed, but the number of vias is not particularly limited, provided that there be not less than two, and the number can be, for example, three or more. The foregoing description relates to the configuration of the thermal electromagnetic wave detection element 1.

2. Method for Producing a Thermal Electromagnetic Wave Detection Element

The following describes a method for producing a thermal electromagnetic wave detection element (a method for producing the thermal electromagnetic wave detection element of the invention), relating by way of example to a method for producing the thermal electromagnetic wave detection element 1. For the sake of convenience of description, the following description specifies the constituent materials of each of the parts, but the constituent materials of each of the parts are in no way limited to those specified herein, and it would be possible to use a variety of materials, as described earlier.

The method for producing the thermal electromagnetic wave detection element 1 includes: a step for obtaining a laminate 9 having the substrate 2, the membrane 4 provided on the substrate 2, and the detection unit 5, which is provided on the membrane 4 and is able to extract from the lower electrode 511 and the upper electrode 513 an electrical signal corresponding to the amount of infrared rays (light) (electromagnetic waves) received; a step for forming the electrically conductive vias 31, 32, which perforate through the substrate 2 and are electrically connected to the lower electrode 511 and the upper electrode 513; and a step for subjecting the substrate 2 to an etching process and forming the void 23, which opens on the membrane 4 side, in between the via 31 and the via 32 of the substrate 2. The following provides a more detailed description.

[1] Step for Preparing the Substrate

Figure 3A:
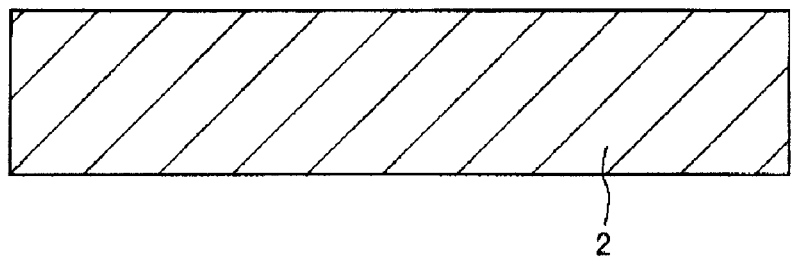
FIGS. 3A-3C are cross-sectional views for describing a method for producing the thermal electromagnetic wave detection element illustrated in FIG. 1.

Firstly, as illustrated in FIG. 3A, the substrate 2, which is constituted of Si, is prepared.

[2] Step for Bonding the Substrate

Figure 3B:
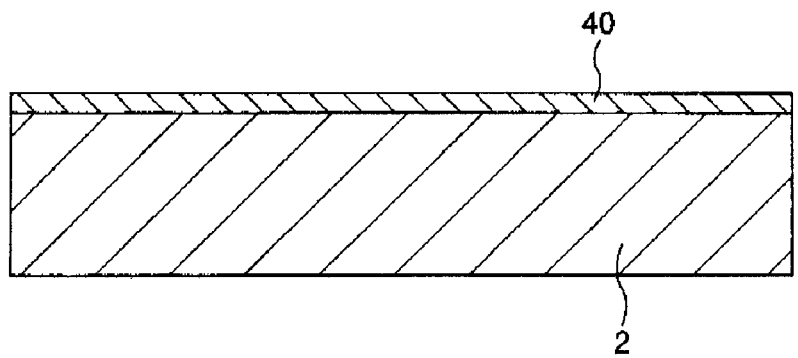

Next, as illustrated in FIG. 3B, a substrate 40, which is constituted of SiO2, is bonded to the upper surface of the substrate 2. The substrate 40 is a substrate which will become the membrane 4 after a subsequent patterning step.

[3] Patterning Step

Figure 3C:
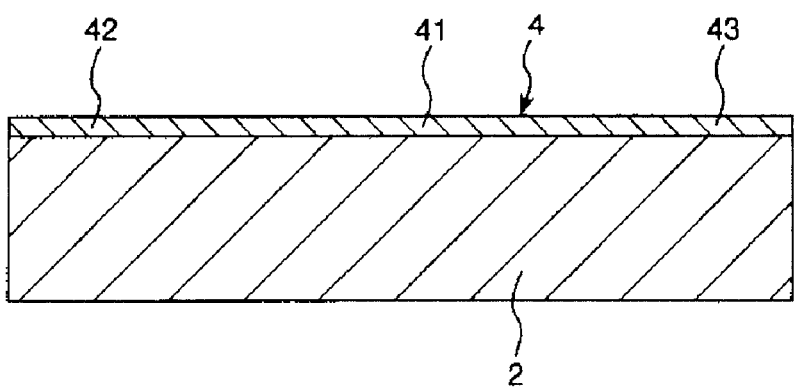

Next, as illustrated in FIG. 3C, masks corresponding to the mounting part 41 and the arms 42, 43 are formed on the upper surface of the substrate 40 using, for example, a photolithography technique, and the substrate 40 is patterned using a dry etching technique, following which the masks are removed. The membrane 4, on which the mounting part 41 and the arms 42, 43 are integrally formed, is thereby formed.

[4] Step for Forming the Detection Unit

Next, the lower electrode 511 is formed on the upper surface of the mounting part 41. More specifically, firstly, Ir (iridium), IrOx (iridium oxide), and Pt (platinum) are deposited in the stated order by vapor deposition, sputtering, ion plating, physical vapor deposition (PVD), chemical vapor deposition (CVD), or a similar gas phase deposition technique. Next, a mask corresponding to the lower electrode 511 is formed on the film by using a photolithography technique or the like, and the film is patterned by using dry etching or the like, following which the mask is removed. The lower electrode 511 is formed thereby.

Next, the pyroelectric layer 512 is formed on the upper surface of the lower electrode 511. More specifically, firstly, the material constituting the pyroelectric layer 512 (the pyroelectric body) is deposited by a gas phase deposition such as was described earlier, or by a sol gel technique. Next, a mask corresponding to the pyroelectric layer 512 is formed on the film by using a photolithography technique or the like, and the film is patterned by using dry etching or the like, following which the mask is removed. The pyroelectric layer 512 is thereby formed.

Figure 4A:
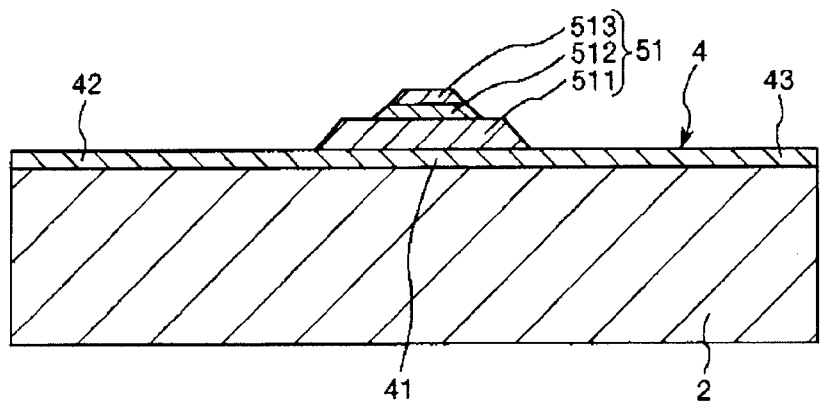
FIGS. 4A-4C are cross-sectional views for describing a method for producing the thermal electromagnetic wave detection element illustrated in FIG. 1.

Next, the upper electrode 513 is formed on the upper surface of the pyroelectric layer 512. More specifically, firstly, Ir (iridium), IrOx (iridium oxide), and Pt (platinum) are deposited in the stated order by a gas phase deposition such as was described earlier. Next, a mask corresponding to the upper electrode 513 is formed on the film by using a photolithography technique or the like, and the film is patterned by using dry etching or the like, following which the mask is removed. The upper electrode 513 is formed thereby. The capacitor 51 is formed by the foregoing, as illustrated in FIG. 4A.

Next, the insulating film 52 is formed so as to cover the capacitor 51. More specifically, firstly, SiO2 or Si3N4 is deposited by a gas phase deposition such as was described earlier. Next, a mask corresponding to the insulating film 52 is formed on the film by using a photolithography technique or the like, and the film is patterned by using dry etching or the like, following which the mask is removed. The insulating film 52 is thereby formed.

Next the first and second contact holes 521, 522 are formed on the insulating film 52. More specifically, a mask corresponding to the sites excepting the first and second contact holes 521, 522 is formed on the insulating film 52 by using a photolithography technique or the like, and the insulating film 52 is patterned by dry etching or the like, following which the mask is removed. The first contact hole 521 and the second contact hole 522 are formed thereby on the insulating film 52.

Next, the lower electrode wiring 53 and the upper electrode wiring 54 are formed. More specifically, firstly, Al (aluminum) is deposited by a gas phase deposition such as was described earlier so as to straddle the upper surface of the membrane 4 and the upper surface of the insulating film 52. The deposition is carried out so that the inside of the first and second contact holes 521, 522 is filled with the Al. Next, a mask corresponding to the lower electrode wiring 53 and the upper electrode wiring 54 is formed on the film by using a photolithography technique or the like, and the film is patterned by using dry etching or the like, following which the mask is removed. The lower electrode wiring 53, which is electrically connected to the lower electrode 511 by way of the first contact hole 521 and is drawn out to the arm 42, is thereby formed; also formed thereby is the upper electrode wiring 54, which is electrically connected to the upper electrode 513 by way of the second contact hole 522 and is drawn out to the arm 43.

Figure 4B:
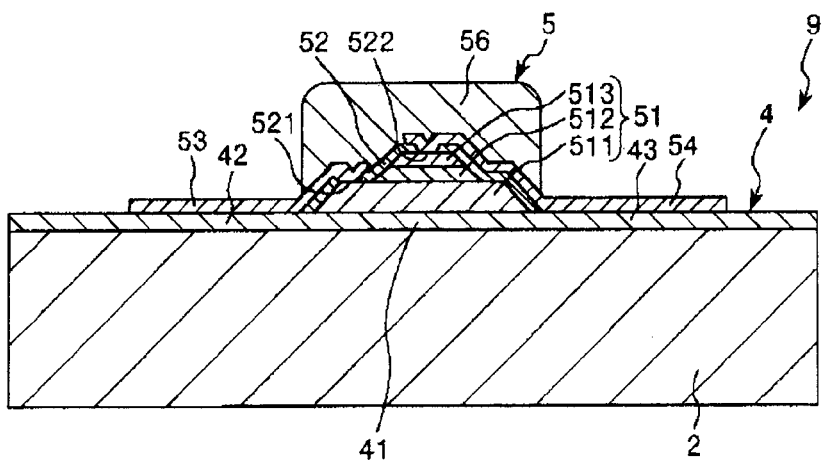

Next, the infrared ray absorption film 56 is formed so as to overlap with the capacitor 51. More specifically, firstly, Si3N4 is deposited by a gas phase deposition such as was described earlier. Next, a mask corresponding to the infrared ray absorption film 56 is formed on the film by using a photolithography technique or the like, and the film is patterned by using dry etching or the like, following which the mask is removed. The infrared ray absorption film 56 is thereby formed. The detection unit 5 is formed and the laminate 9 is obtained by the foregoing, as illustrated in FIG. 4B.

[5] Step for Forming the Vias

Figure 4C:
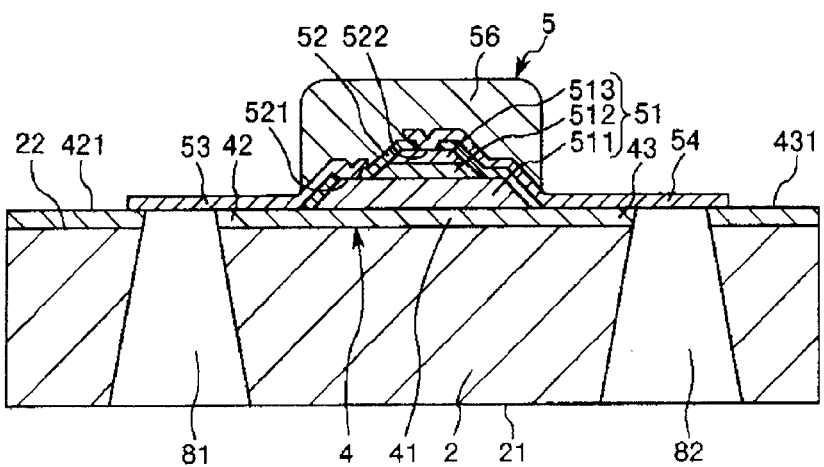
Figure 5A:
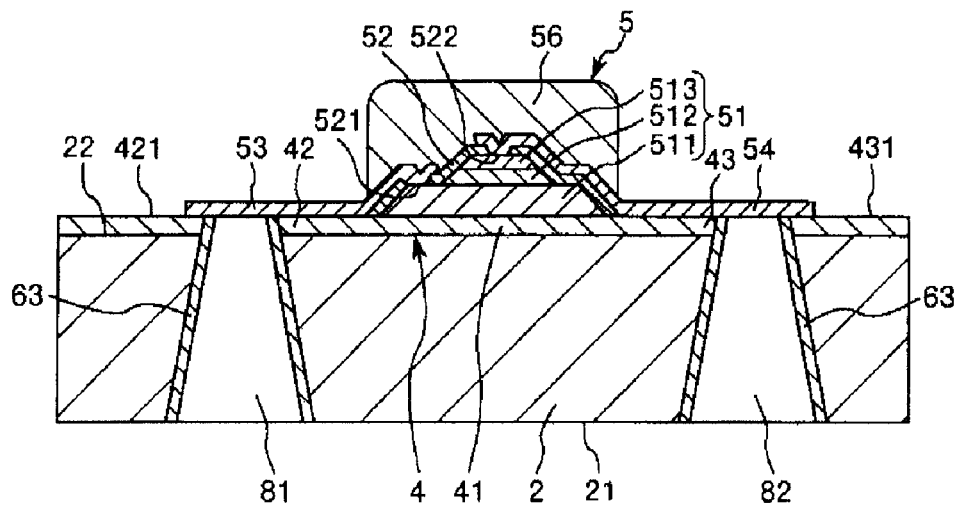
FIGS. 5A and 5B are cross-sectional views for describing a method for producing the thermal electromagnetic wave detection element illustrated in FIG. 1.
Figure 5B:
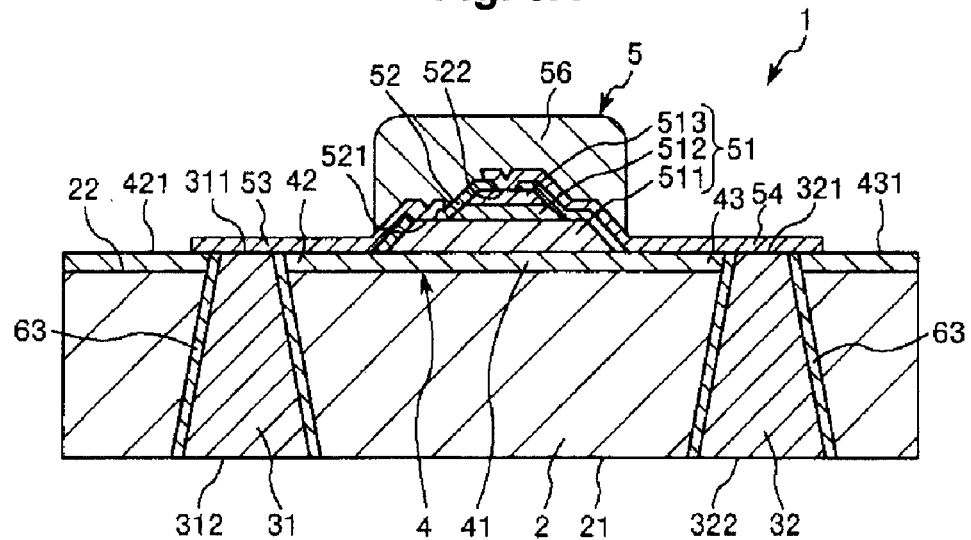

Firstly, as illustrated in FIG. 4C, a mask corresponding to the sites excepting the vias 31, 32 and the insulating film 63 is formed on the lower surface 21 of the substrate 2 by using a photolithography technique or the like, and holes 81, 82 that perforate through the substrate 2 and the membrane 4 (through holes) are formed by using dry etching or the like, and the mask is removed. Next, as illustrated in FIG. 5A, the insulating film 63, constituted of Al2O3, is formed on an inner peripheral surface of the holes 81, 82 by a gas phase deposition such as was described earlier. Next, as illustrated in FIG. 5B, the holes 81, 82 are filled with Cu (copper), thus forming the vias 31, 32.

[6] Step for Forming the External Connection Terminals

Figure 6A:
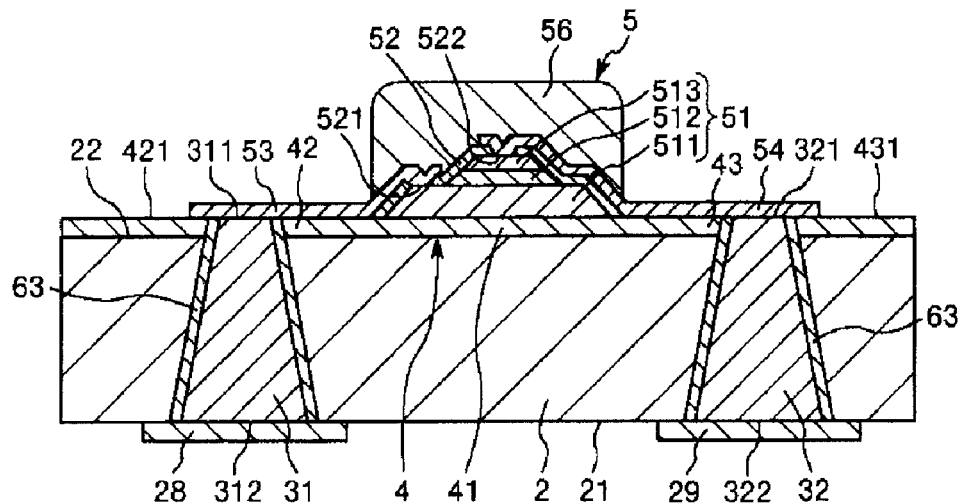
FIGS. 6A and 6B are cross-sectional views for describing a method for producing the thermal electromagnetic wave detection element illustrated in FIG. 1.

Next, as illustrated in FIG. 6A, the external connection terminals 28, 29 are formed on the lower surface 21 of the substrate 2. More specifically, firstly, an Ni—Cr-based alloy and Au (gold) are deposited in the stated order on the lower surface 21 of the substrate 2 by a gas phase deposition such as was described earlier. Next, a mask corresponding to the external connection terminals 28, 29 is formed on the film by using a photolithography technique or the like, and the film is patterned by using dry etching or the like, following which the mask is removed. The external connection terminals 28, 29 are thereby formed.

[7] Step for Forming the Void

Figure 6B:
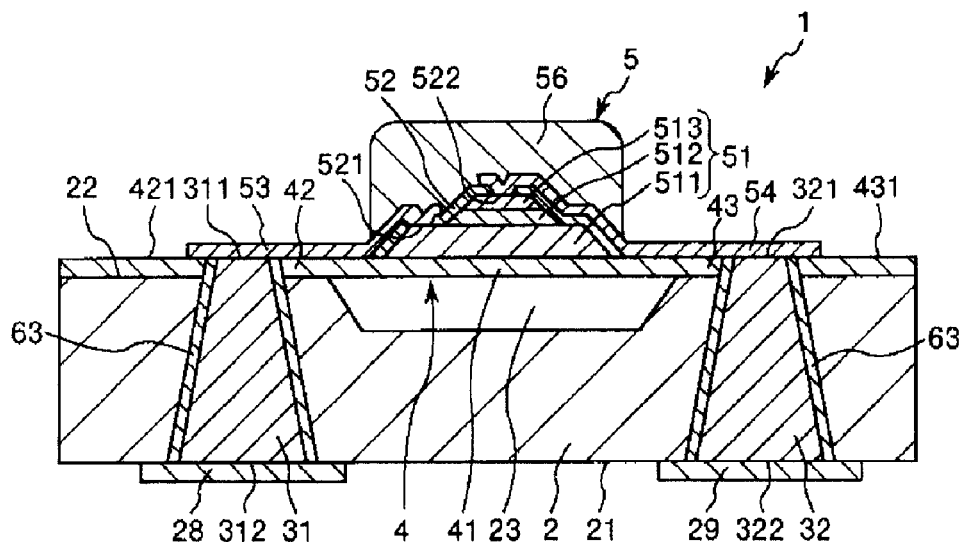

Next, as illustrated in FIG. 6B, the substrate 2 is subjected to an etching process and the void 23 is formed. More specifically, a photolithography technique or the like is used to form a mask corresponding to the sites excepting the site where the void 23 is to be formed, and the void 23 is formed by dry etching or the like, following which the mask is removed.

The etching involves the use of such a treatment gas that the etching rate of the substrate 2 is greater than the etching rate of the membrane 4. One example of a treatment gas where the etching rate of Si is greater than the etching rate of SiO2 would be XeF2, among others. In a case where formation is carried out by wet etching, one example of an etchant would be KOH, among others. The thermal electromagnetic wave detection element 1 is obtained by the foregoing.

According to the method of production of such description, it is possible to prevent stress from being concentrated at the corners of the void 23 within the substrate 2, possible to prevent damage to or deformation of the substrate 2 or the like in the vicinity of the corners of the void 23, and possible to readily produce a highly reliable thermal electromagnetic wave detection element 1. Further, because the void 23 is formed in the substrate 2, there is no need to use a sacrificial layer made of a resin having low heat resistance, and this allows for the temperature in the course of forming the detection unit 5 to be at a temperature sufficient for the formation of the detection unit 5 without any problems arising, thereby making it possible to form a high-performance detection unit 5.

The method for producing the thermal electromagnetic wave detection element 1 is not limited to the method described above; rather, for example, the sequence of the step for forming the detection unit 5 and the step for forming the vias 31, 32 can be inverted within the method described above. That is, another method for producing the thermal electromagnetic wave detection element 1 includes: a step for obtaining a laminate having the substrate 2 as well as the membrane 4 provided on the substrate 2; a step for forming the electrically conductive vias 31, 32, which perforate through the substrate 2; a step for forming on the membrane 4 the detection unit 5, which includes the lower electrode 511 and the upper electrode 513 electrically connected to the vias 31, 32 and is able to extract from the lower electrode 511 and the upper electrode 513 an electrical signal corresponding to the amount of infrared rays (light) (electromagnetic waves) received; and a step for subjecting the substrate 2 to an etching process and forming the void 23, which opens on the membrane 4 side, in between the via 31 and the via 32 of the substrate 2.

Second Embodiment

Figure 7:
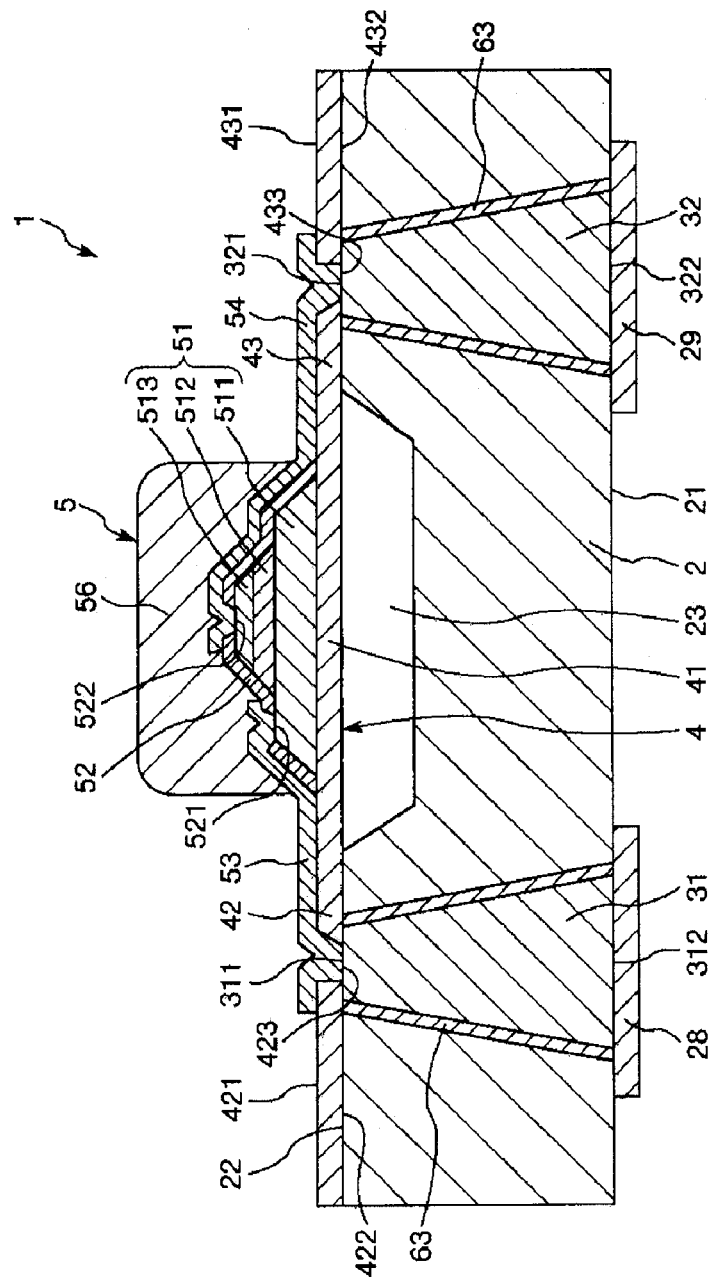
FIG. 7 is a cross-sectional view illustrating a thermal electromagnetic wave detection element as in a second embodiment of the invention.

The following describes the second embodiment of the thermal electromagnetic wave detection element of the invention. FIG. 7 is a cross-sectional view illustrating the thermal electromagnetic wave detection element as in the second embodiment of the invention. Hereinbelow, for the sake of convenience of description, the upper side in FIG. 7 is called "above", "up", or "upper"; the lower side is called "below", "down", or "lower"; the right side is called "right"; and the left side is called "left".

The following description of the thermal electromagnetic wave detection element of the second embodiment centers on the points of difference from the first embodiment described above, and a description of features that are similar has been omitted. As illustrated in FIG. 7, in the thermal electromagnetic wave detection element 1 of the second embodiment, the vias 31, 32 do not perforate through the membrane 4. More specifically, the membrane 4 side of the vias 31, 32, i.e., the upper surfaces (top surfaces) 311, 321 are positioned on a surface of the membrane 4 on the substrate 2 side, i.e., are positioned on the side of the lower surface 422 of the arm 42 and of the lower surface 432 of the arm 43. The upper surface 311 of the via 31 and the upper surface 321 of the via 32 are matched to the upper surface 22 of the substrate 2.

A contact hole 423 that perforates through the arm 42 is formed at a site corresponding to the upper surface 311 of the via 31 on the arm 42. The lower electrode wiring 53 perforates at the distal end thereof through the arm 42, i.e., passes through the contact hole 423 and comes into contact with the upper surface 311 of the via 31, and is thus electrically connected to the via 31. Similarly, a contact hole 433 that perforates through the arm 43 is formed at a site corresponding to the upper surface 321 of the via 32 on the arm 43. The upper electrode wiring 54 perforates at the distal end thereof through the arm 43, i.e., passes through the contact hole 433 and comes into contact with the upper surface 321 of the via 32, and is thus electrically connected to the via 32.

This makes it possible to further reduce the surface area of contact between the lower electrode wiring 53 and upper electrode wiring 54 and the vias 31, 32, thereby making it possible to curb the transfer of the heat of the detection unit 5 to the vias 31, 32 through the lower electrode wiring 53 and the upper electrode wiring 54. For this reason, infrared rays can be more efficiently detected with the detection unit 5. The second embodiment of such description, too, makes it possible to bring about an effect similar to that of the first embodiment described above.

Third Embodiment

Figure 8:
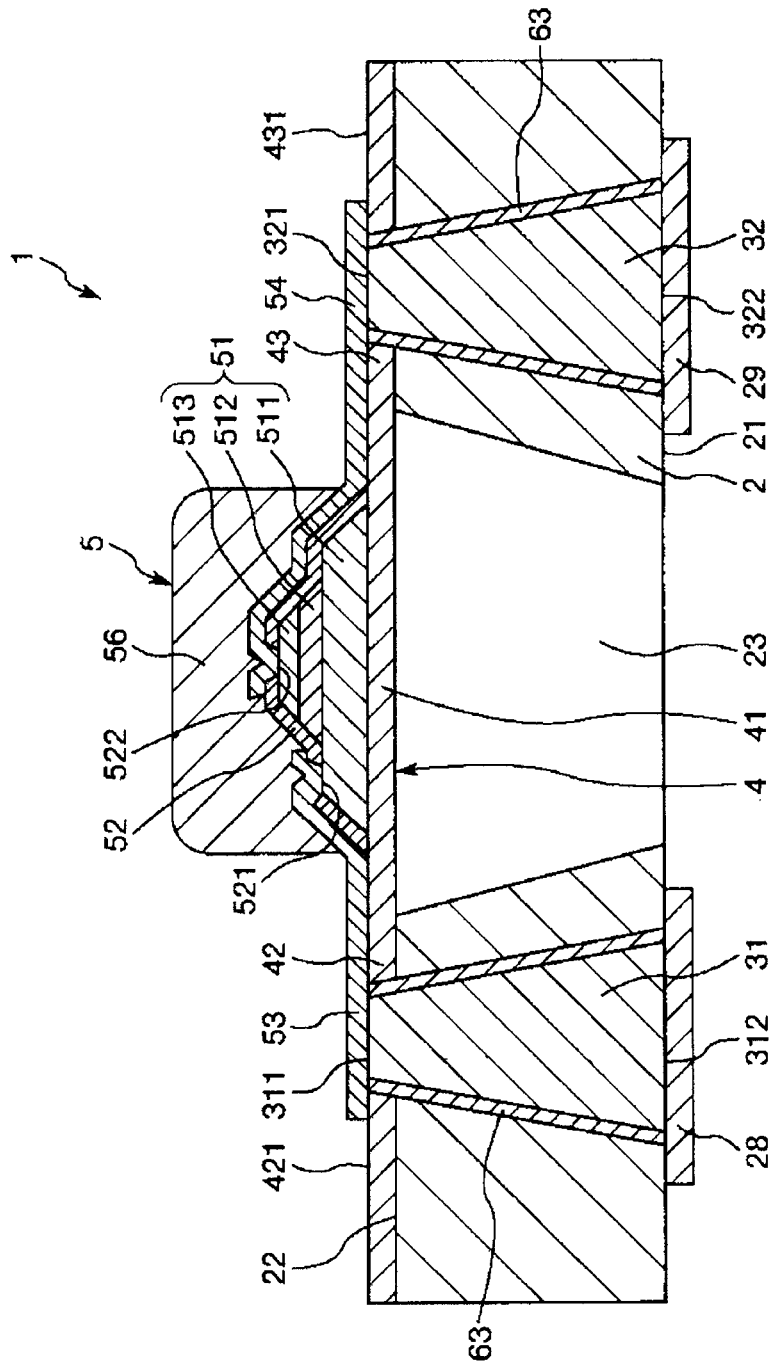
FIG. 8 is a cross-sectional view illustrating a thermal electromagnetic wave detection element as in a third embodiment of the invention.

The following describes the third embodiment of the thermal electromagnetic wave detection element of the invention. FIG. 8 is a cross-sectional view illustrating the thermal electromagnetic wave detection element as in the third embodiment of the invention. Hereinbelow, for the sake of convenience of description, the upper side in FIG. 8 is called "above", "up", or "upper"; the lower side is called "below", "down", or "lower"; the right side is called "right"; and the left side is called "left".

The following description of the thermal electromagnetic wave detection element of the third embodiment centers on the points of difference from the first embodiment described above, and a description of features that are similar has been omitted. As illustrated in FIG. 8, in the thermal electromagnetic wave detection element 1 of the third embodiment, the void 23 perforates through the substrate 2 in the thickness direction thereof. In other words, the void is opened not only on the upper surface 22 side of the substrate 2, i.e., the membrane 4 side of the substrate 2, but also on the lower surface 21 side of the substrate 2, i.e., the side of the substrate 2 opposite to the membrane 4.

This makes it possible for the thickness of the substrate 2 to be relatively thin, and makes it possible to reduce the scale of the thermal electromagnetic wave detection element 1. The third embodiment of such description, too, makes it possible to bring about an effect similar to that of the first embodiment described above. The third embodiment could also be applied to the second embodiment described above. That is, within the second embodiment as well, the void 23 can also be opened on the lower surface 21 side of the substrate 2, i.e., on the side of the substrate 2 opposite to the membrane 4.

3. Thermal Electromagnetic Wave Detection Device

Figure 9:
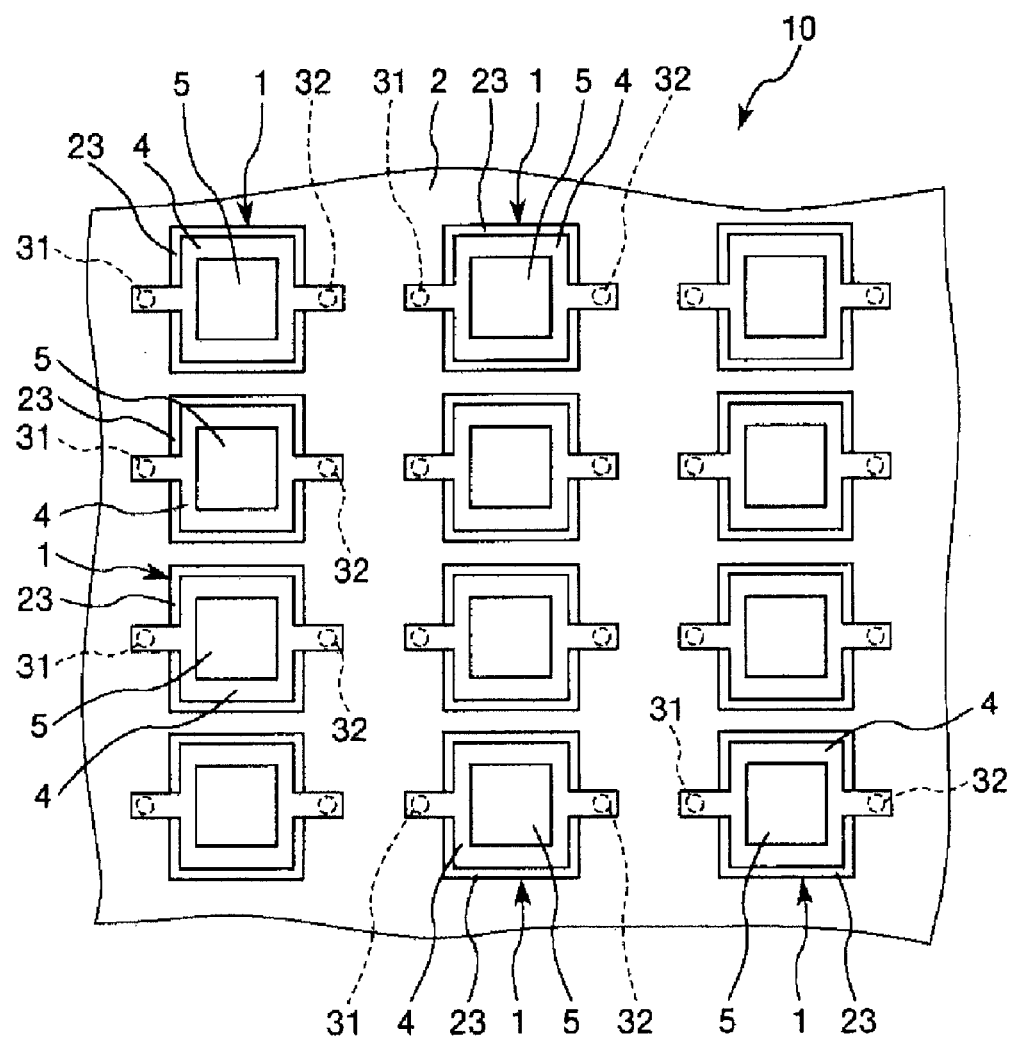
FIG. 9 is a plan view illustrating a preferred embodiment of a thermal electromagnetic wave detection device of the invention.

The following describes a thermal electromagnetic wave detection device 10 to which the thermal electromagnetic wave detection element 1 has been applied (the thermal electromagnetic wave detection device of the invention). FIG. 9 is a plan view illustrating a preferred embodiment of the thermal electromagnetic wave detection device of the invention, and FIG. 10 is a cross-sectional view of the thermal electromagnetic wave detection device illustrated in FIG. 9.

Figure 10:
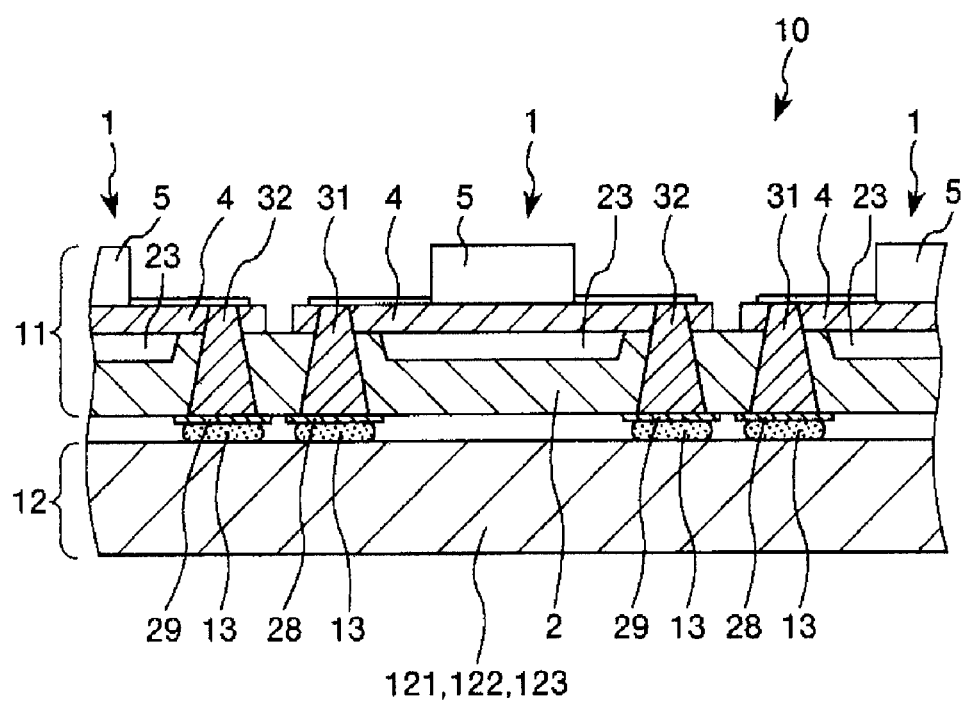
FIG. 10 is a cross-sectional view of the thermal electromagnetic wave detection device illustrated in FIG. 9.

As illustrated in FIGS. 9 and 10, a sensor device (thermal electromagnetic wave detection device) 10 includes a sensor substrate 11 on which a plurality of thermal electromagnetic wave detection elements 1 are arranged in the shape of a matrix in two orthogonal axial directions, and a circuit board 12 which is positioned below the sensor substrate 11 and on which circuits for processing the signals from the thermal electromagnetic wave detection elements 1 are formed. The number of the thermal electromagnetic wave detection elements 1 arranged on the sensor substrate 11 could be, for example, about 320×240. A display resolution on a quarter video graphics array (QVGA) level is thereby obtained; also, in a case where, for example, the sensor device 10 is applied to a camera or the like, it would be possible to provide images of a resolution that is different depending on the intended use thereof and yet is sufficient. The number of the thermal electromagnetic wave detection elements 1 arranged on the sensor substrate 11 is, however, not particularly limited, and can be, for example, about 640×480. A display resolution on a video graphics array (VGA) level is thereby obtained, and it is possible to provide images having a high resolution.

The sensor substrate 11 is of a similar configuration to that of the thermal electromagnetic wave detection element 1 described above, except in that the substrate 2 is shared among the thermal electromagnetic wave detection elements 1. That is, the sensor substrate 11 includes the substrate 2, a plurality of the membranes 4 supported on the substrate 2 through the vias 31, 32, and a plurality of the detection units 5 that are mounted onto each of the membranes 4. The region occupied by a single thermal electromagnetic wave detection element 1 is, for example, about 30×30 μm. The configuration of each of the parts is similar to what was described earlier, and thus a description thereof has been omitted.

The circuit board 12 is electrically connected via connection bumps 13 to the plurality of external connection terminals 28, 29 formed on the lower surfaces of the substrates 2. The circuit board 12 and each of the thermal electromagnetic wave detection elements 1 are thereby electrically connected to each other. Herein, as described earlier, the lower electrodes 511 and the upper electrodes 513 are drawn out to the lower surfaces of the substrates 2 by the vias 31, 32 in each of the thermal electromagnetic wave detection elements 1, and thus it is readily possible to achieve an electrical connection between the sensor substrate 11 and the circuit board 12.

The circuit board 12 includes, for example, a read circuit (read-out integrated circuit (ROIC)) 121 formed so as to correspond to each of the thermal electromagnetic wave detection elements 1, a control circuit 122 for controlling the drive of each of the thermal electromagnetic wave detection elements 1, and an analog/digital (A/D) conversion circuit 123. The control circuit 122 has the function of controlling the drive of each of the thermal electromagnetic wave detection elements 1. Each of the read circuits 121 individually processes the signal outputted from the corresponding thermal electromagnetic wave detection element 1. Having been processed by the read circuits 121, the signals coming from each of the thermal electromagnetic wave detection elements 1 are converted to digital signals by the A/D conversion circuit 123 and are outputted as digital image signals. In the configuration depicted, there are a plurality of the thermal electromagnetic wave detection elements 1 arranged two-dimensionally, but there is no limitation thereto, and there can also be a plurality of the thermal electromagnetic wave detection elements 1 arranged side by side in a single column (a single axial direction). In such a case, the thermal electromagnetic wave detection elements can be arranged side by side in a rectilinear fashion, or otherwise can also be arranged side by side in, for example, a circular fashion.

4. Electronic Apparatus

The following describes electronic apparatuses to which the thermal electromagnetic wave detection element 1 (the sensor device 10) has been applied (the electronic apparatus of the invention).

(Terahertz Camera)

Figure 11:
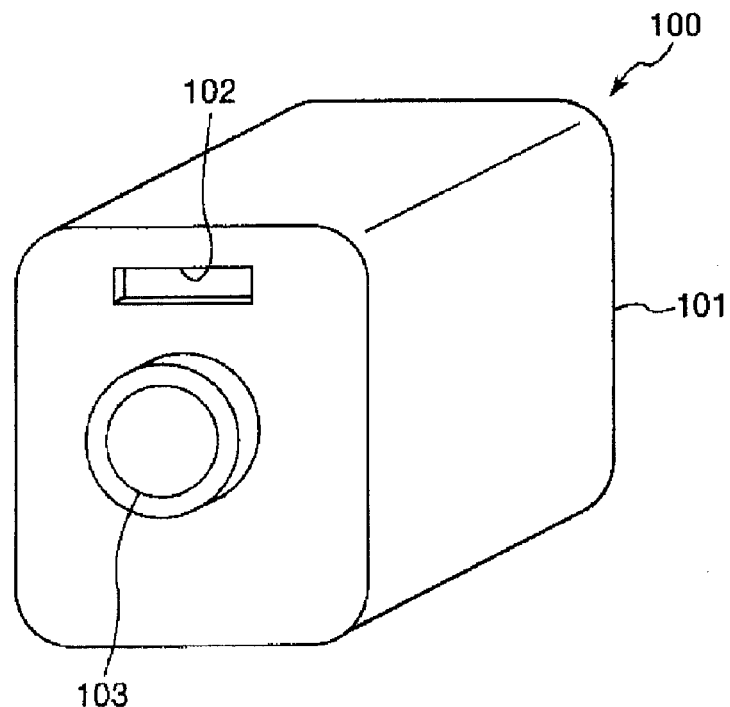
FIG. 11 is a drawing illustrating an electronic apparatus (terahertz camera) provided with the thermal electromagnetic wave detection element of the invention.

FIG. 11 schematically illustrates the configuration of a terahertz camera 100 as in one specific example of an electronic apparatus in which the sensor device 10 is used. In FIG. 11, the terahertz camera 100 is provided with a housing 101. At a front surface of the housing 101, a slit 102 is formed, and a lens 103 is mounted. A subject is irradiated with terahertz-band electromagnetic waves from the slit 102. Such electromagnetic waves encompass radio waves, such as terahertz waves, as well as light, such as infrared rays. The terahertz band encompasses a frequency band of 100 GHz to 30 THz. The lens 103 takes in the terahertz-band electromagnetic waves that have been reflected from the subject.

Figure 12:
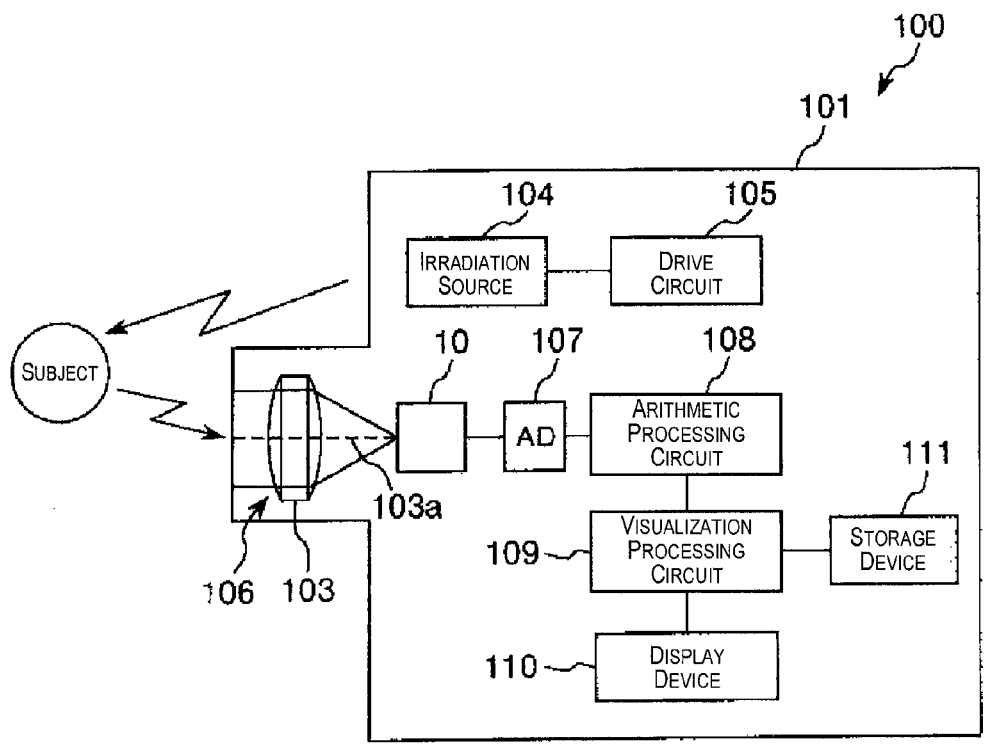
FIG. 12 is a block diagram illustrating in greater detail the terahertz camera illustrated in FIG. 11.

To provide a more detailed description of the configuration of the terahertz camera 100, the terahertz camera 100 is provided with an irradiation source (electromagnetic wave source) 104, as illustrated in FIG. 12. A drive circuit 105 is connected to the irradiation source 104. The drive circuit 105 supplies a desired drive signal to the irradiation source 104. The irradiation source 104 releases terahertz-band electromagnetic waves in accordance with the receipt of the drive signal. For the irradiation source 104, for example, a laser light source is used.

The lens 103 constitutes an optical system 106. In addition to the lens 103, the optical system 106 can also be provided with an optical component. The sensor device 10 is arranged on an optical axis 103a of the lens 103. The optical system 106 captures an image onto the matrix of the thermal electromagnetic wave detection elements 1. An analog/digital conversion circuit 107 is connected to the sensor device 10. The outputs of the thermal electromagnetic wave detection elements 1 are supplied sequentially in time series from the sensor device 10 to the analog/digital conversion circuit 107. The analog/digital conversion circuit 107 converts the outputted analog signals to digital signals.

A arithmetic processing circuit (processing circuit) 108 is connected to the analog/digital conversion circuit 107. Digital image data is supplied from the analog/digital conversion circuit 107 to the arithmetic processing circuit 108. The arithmetic processing circuit 108 processes the image data and generates pixel data for every pixel of a display screen. A visualization processing circuit 109 is connected to the arithmetic processing circuit 108. The visualization processing circuit 109 generates visualization data on the basis of the pixel data. A display device 110 is connected to the visualization processing circuit 109. For the display device 110, it would be possible to use, for example, a flat panel display such as a liquid crystal display. The display device 110 displays an image on a screen on the basis of the visualization data. The visualization data can be stored in a storage device 111. The terahertz camera 100 can be used as a scanning device on the basis of transmittance with respect to paper, plastic, fiber, or other objects, as well as of the absorption spectrum specific to a substance.

In addition, the terahertz camera 100 can be utilized to qualitatively analyze or quantitatively analyze a substance. In such a usage, for example, a filter of a specific frequency is arranged on the optical axis 103a of the lens 103. The filter has the function of blocking electromagnetic waves other than those of a specific wavelength. As such, only the electromagnetic waves of the specific wavelength reach the sensor device 10, and the presence or absence of the specific substance is detected thereby.

(Infrared Camera)

Figure 13:
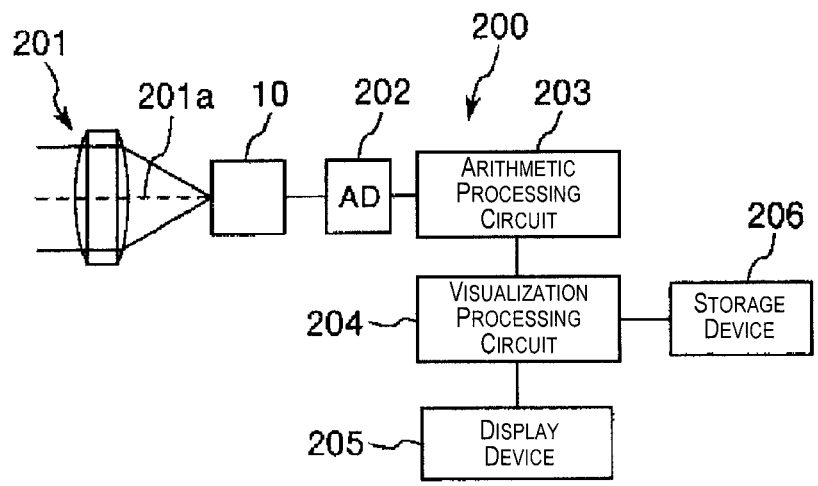
FIG. 13 is a drawing illustrating an electronic apparatus (infrared camera) provided with the thermal electromagnetic wave detection element of the invention.

FIG. 13 schematically illustrates the configuration of an infrared camera 200 as in a specific example of an electronic apparatus in which the sensor device 10 is used. In FIG. 13, the infrared camera 200 is provided with an optical system 201. The sensor device 10 is arranged on an optical axis 201a of the optical system 201. The optical system 201 captures an image on the matrix of the thermal electromagnetic wave detection elements 1. An analog/digital conversion circuit 202 is connected to the sensor device 10. The outputs of the thermal electromagnetic wave detection elements 1 are supplied sequentially in time series from the sensor device 10 to the analog/digital conversion circuit 202. The analog/digital conversion circuit 202 converts the outputted analog signals to digital signals.

A arithmetic processing circuit (processing circuit) 203 is connected to the analog/digital conversion circuit 202. Digital image data is supplied from the analog/digital conversion circuit 202 to the arithmetic processing circuit 203. The arithmetic processing circuit 203 processes the image data and generates pixel data for every pixel of a display screen. A visualization processing circuit 204 is connected to the arithmetic processing circuit 203. The visualization processing circuit 204 generates visualization data on the basis of the pixel data. A display device 205 is connected to the visualization processing circuit 204. For the display device 205, it would be possible to use, for example, a flat panel display such as a liquid crystal display. The display device 205 displays an image on a screen on the basis of the visualization data. The visualization data can be stored in a storage device 206.

The infrared camera 200 can be utilized in the form of thermography. In such a case, the infrared camera 200 would be able to project a thermal distribution image onto the screen of the display device 205. Generating the thermal distribution image entails setting the colors of the pixels for every temperature band in the arithmetic processing circuit 203. Thermography can be used to measure the temperature distribution in a person's body or to measure the body temperature itself. In addition, thermography can be incorporated into a factory automation (FA) apparatus and used to detect thermal leakage or abnormal temperature changes.

Figure 14:
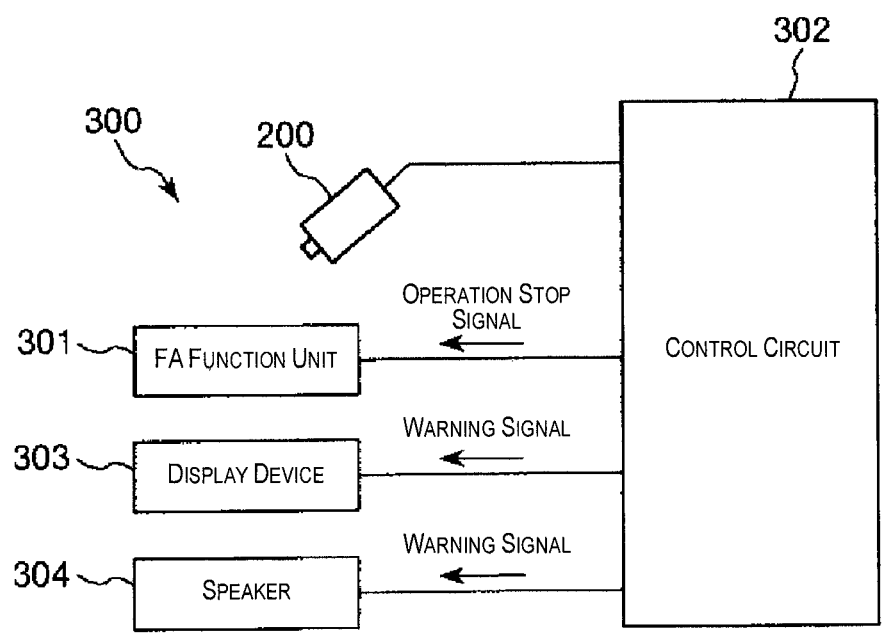
FIG. 14 is a drawing illustrating an electronic apparatus (FA apparatus) provided with the thermal electromagnetic wave detection element of the invention.

For example, as illustrated in FIG. 14, an FA apparatus (electronic apparatus) 300 is provided with an FA function unit 301. The FA function unit 301 operates in the realization of a specific function. A control circuit (processing circuit) 302 is connected to the FA function unit 301. The control circuit 302 controls heating, pressurization, mechanical treatment, chemical treatment, or other operations of the FA function unit 301.

Connected to the control circuit 302 are the infrared camera 200, a display device 303, a speaker 304, and the like. The infrared camera 200 captures an image of the FA function unit 301 within an image-capturing range. Upon detection of an abnormally high temperature or abnormal temperature change within the image-capturing range, the control circuit 302 either outputs an operation stop signal to the FA function unit 301 or outputs a warning signal to the display device 303 or the speaker 304.

In the event an abnormally high temperature or abnormal temperature change is detected, the control circuit 302 holds reference temperature distribution data within, for example, a memory (not shown). The reference temperature distribution data specifies a temperature distribution for within the image-capturing range during normal operation. The control circuit 302 can check the real-time thermal distribution image against the thermal distribution of the reference temperature distribution data. In addition, thermography can be used detect an object on the basis of the temperature difference between the object and the surroundings.

The infrared camera 200 can be utilized as a night vision camera, i.e., dark vision camera. In such a case, the infrared camera 200 can, for example, project an image of darkness on the display device 205. The night vision camera can be used, for example, as a monitoring camera as a specific example of a security apparatus, as a human sensor, as a drive assist device, and so forth. A human sensor can be used to control turning ON or OFF an escalator or illumination equipment or an electrical apparatus (household appliance) such as an air conditioner or television, among other controls.

Figure 15:
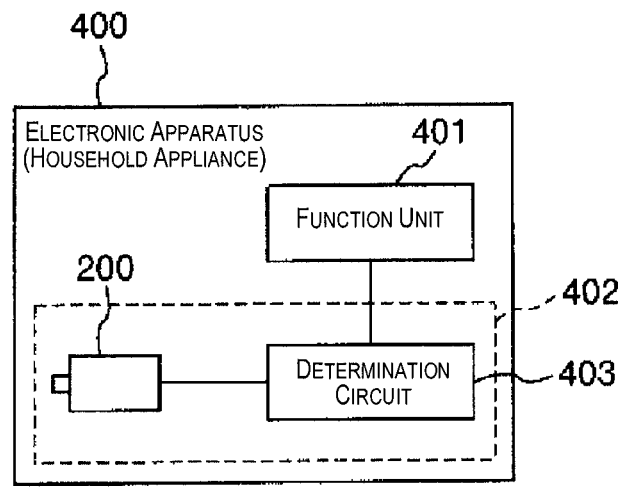
FIG. 15 is a drawing illustrating an electronic apparatus (electrical apparatus) provided with the thermal electromagnetic wave detection element of the invention.

For example, an electrical apparatus 400 is provided with a function unit 401, as illustrated in FIG. 15. The function unit 401 implements a mechanical operation or electrical operation in the course of realizing a specific function. A human sensor 402 is connected to the function unit 401. The human sensor 402 is provided with the infrared camera 200. The infrared camera 200 implements image capturing within a monitoring range. A determination circuit 403 is connected to the infrared camera 200.

The determination circuit 403 determines whether a person is present or absent on the basis of the thermal distribution image. The determination entails the determination circuit 403 detecting movement of a specific temperature range (for example, a mass having a body-temperature range) within the image. The determination circuit 403 supplies to the function unit 501a determination signal specifying the presence or absence of a person. The function unit 401 is, for example, controlled ON or OFF in accordance with the receipt of the determination signal.

Figure 16:
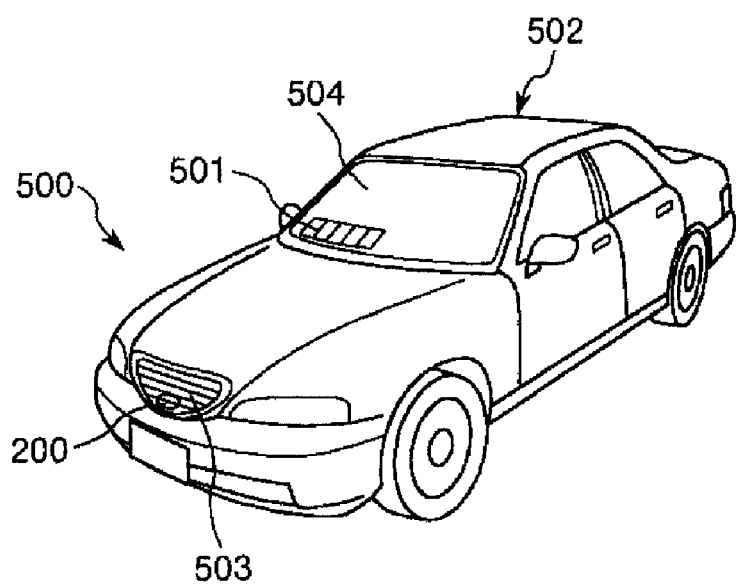
FIG. 16 is a drawing illustrating an electronic apparatus (drive assist device) provided with the thermal electromagnetic wave detection element of the invention.

For example, as illustrated in FIG. 16, a drive assist device (electronic apparatus) 500 is provided with the infrared camera 200 and a head-up display 501. The infrared camera 200 is mounted onto, for example, a front nose 503 of a vehicle 502. The infrared camera 200 is arranged at a position for capturing an image of an image-capturing range extending to the front from the vehicle 502. The head-up display 501 is arranged, for example, on a driver's seat side of a front window 504. An image of the infrared camera 200 can be projected onto the head-up display 501. On the screen of the head-up display 501, for example, an image of a pedestrian who has been tracked in the image-capturing range could be highlighted.

Figure 17:
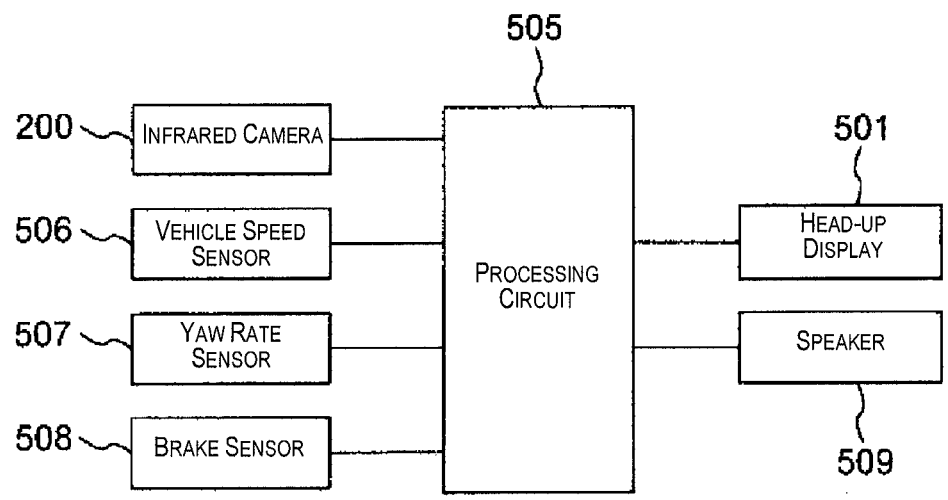
FIG. 17 is a block diagram illustrating in greater detail the drive assist device illustrated in FIG. 16.

As illustrated in FIG. 17, a processing circuit 505 is connected to the infrared camera 200 and to the head-up display 501. Connected to the processing circuit 505 are a vehicle speed sensor 506, a yaw rate sensor 507, and a brake sensor 508. The vehicle speed sensor 506 detects the travel speed of the vehicle 502. The yaw rate sensor 507 detects the yaw rate of the vehicle 502. The brake sensor 508 detects whether or not a brake pedal is being operated. The processing circuit 505 screens for a specific pedestrian in accordance with the travel state of the vehicle 502. The processing circuit 505 specifies the travel state of the vehicle 502 depending on the travel speed and yaw rate of the vehicle 502 and circumstances of stepping on the brake. The processing circuit 505 can, for example, draw the attention of the driver on the basis of audio, from the speaker 509.

(Game Console Controller)

Figure 18:
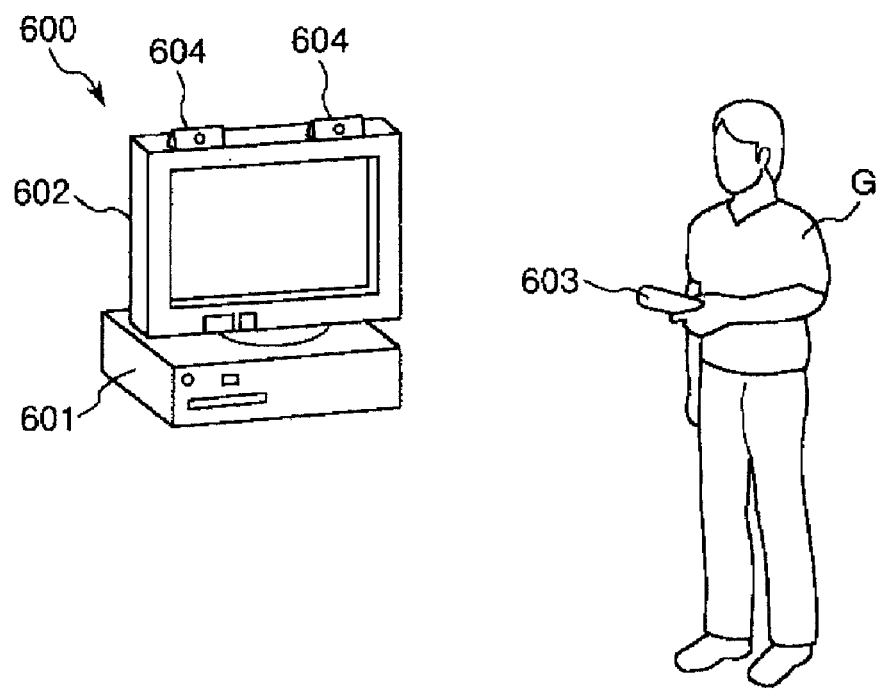
FIG. 18 is a drawing illustrating an electronic apparatus (controller) provided with the thermal electromagnetic wave detection element of the invention.

FIG. 18 schematically illustrates the configuration of a game console 600 as in a specific example of an electronic apparatus in which the sensor device 10 is used. In FIG. 18, a game console 600 is provided with a game console body 601, a display device 602, and a controller (electronic apparatus) 603. The display device 602 is connected to the game console body 601, for example, by a wired connection. The operation of the game console body 601 is projected on a screen of the display device 602. A player G manipulates the operation of the game console body 601 by using the controller 603. Realizing such manipulation entails irradiation of the controller 603 with infrared rays from, for example, a pair of light-emitting diode (LED) modules 604. The LED modules 604 can be mounted onto, for example, a bezel in the periphery of the screen of the display device 602.

Figure 19:
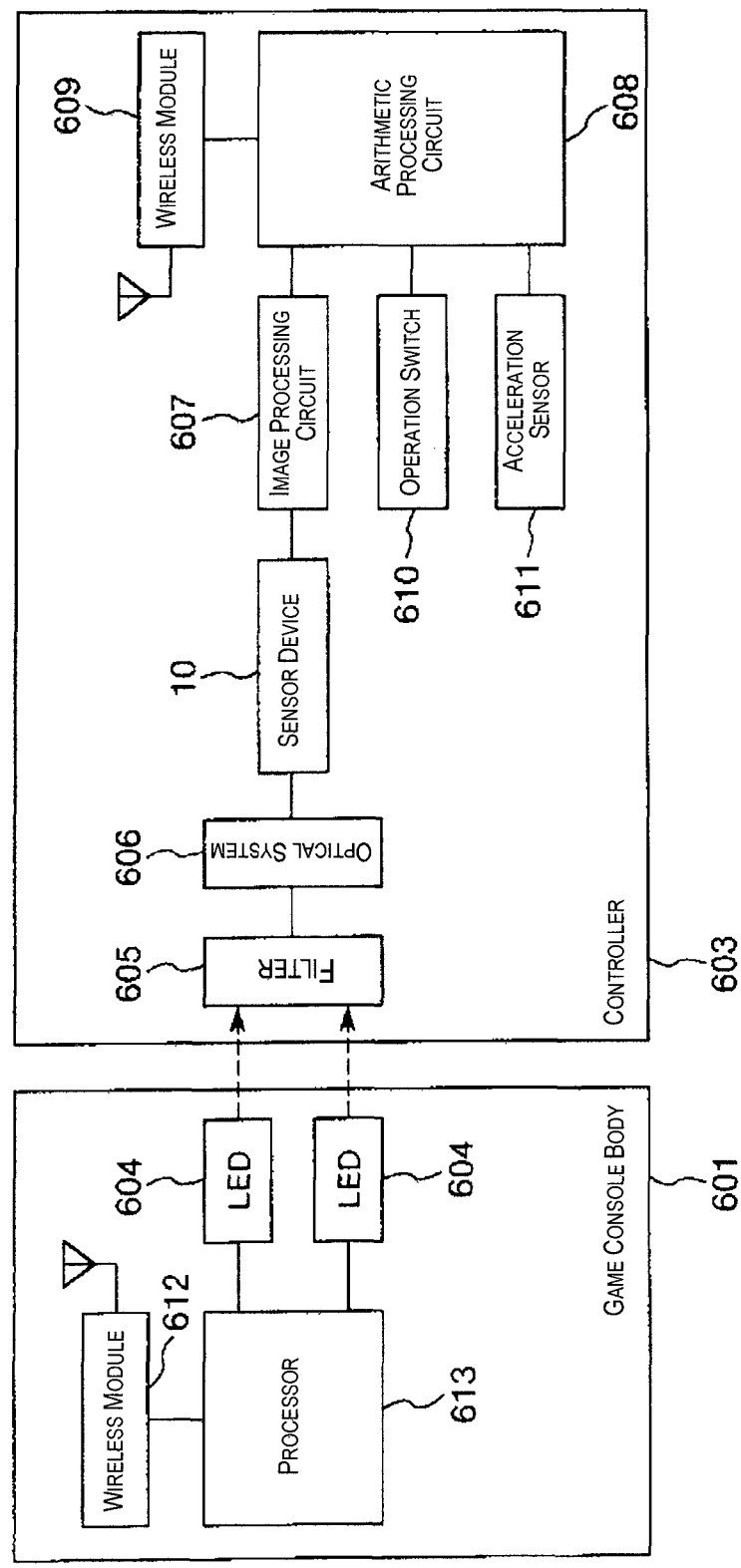
FIG. 19 is a block diagram illustrating in greater detail the controller illustrated in FIG. 18.

As illustrated in FIG. 19, the sensor device 10 is incorporated into the controller 603. An infrared ray filter 605 and an optical system (for example, a lens) 606) can also be incorporated into the sensor device 10. The sensor device 10 is able to receive infrared rays that are emitted from the LED modules 604. An image processing circuit 607 is connected to the sensor device 10. The image processing circuit 607 creates an image from infrared ray spots of the LED modules 604 within a previously established screen.

An arithmetic processing circuit 608 is connected to the image processing circuit 607. The arithmetic processing circuit 608 generates infrared ray spot information. In this infrared ray spot information, the positions and sizes of infrared ray spots are specified on the previously established screen. The positions of the infrared ray spots correspond to the positions of the LED modules 604. The sizes of the infrared ray spots also correspond to the distance to the LED modules 604.

A wireless module 609 is connected to the arithmetic processing circuit 608. The infrared ray spot information is fed into the game console body 601 from the wireless module 609. In the configuration depicted, an operation switch 610 and an acceleration sensor 611 are connected to the arithmetic processing circuit 608. An operation signal of the operation switch 610 and acceleration information of the acceleration sensor 611 are supplied to the game console body 601 from the wireless module 609.

The game console body 601 receives the operation signal, the infrared ray spot information, and the acceleration information at a wireless module 612. A processor 613 within the game console body 601 specifies the operation of the operations witch 610 on the basis of the operation signal, and specifies the movement of the controller 603 on the basis of the infrared ray spot information and the acceleration information. In this manner, the game console body 601 is controlled in accordance with the operation of the operation switch 610 and the movement of the controller 603. The LED modules 604 can be connected to the processor 613. The processor 613 is able to control the operation of the LED modules 604.

The foregoing describes the thermal electromagnetic wave detection element, the method for producing a thermal electromagnetic wave detection element, the thermal electromagnetic wave detection device, and the electronic apparatus of the invention on the basis of the embodiments depicted, but the invention is in no way limited thereto, and the configurations of each of the parts can be substituted with any desired configuration having a similar function. Any other desired component or step can also be added to the invention. Each of the embodiments can also be combined as appropriate.

Further, though the embodiments above described a pyroelectric-type thermal electromagnetic wave detection element, the thermal electromagnetic wave detection element of the invention is not limited to being pyroelectric, and can instead be, for example, a thermocouple-type or resistance-type (bolometer-type) thermal electromagnetic wave detection element. Though the embodiments above describe a configuration in which a detection unit detects infrared rays, there is no particular limitation to the wavelength of the light that is detected by the detection unit.

What is claimed is:

1. A thermal electromagnetic wave detection element, comprising:
   a semiconductor substrate;
   a support member provided on the semiconductor substrate, the support member being disposed in a first direction relative to the semiconductor substrate;
   a detection unit that is provided on the support member and is configured to extract from a pair of electrodes an electrical signal corresponding to a received amount of electromagnetic waves; and
   a pair of electrically conductive vias that perforate through the semiconductor substrate and are electrically connected to the pair of electrodes, each of the vias having a traverse cross-sectional surface area that gradually decreases as approaching to the support member in the first direction;
   a void that opens on the support member side being provided between the pair of vias of the semiconductor substrate.

2. The thermal electromagnetic wave detection element as set forth in claim 1, wherein the void and a surface of the pair of vias on the support member side do not overlap when seen in plan view.

3. The thermal electromagnetic wave detection element as set forth in claim 1, wherein the void is formed by subjecting the semiconductor substrate to an etching process.

4. The thermal electromagnetic wave detection element as set forth in claim 3, wherein the etching rate of a constituent material of the semiconductor substrate in the etching process is higher than the etching rate of a constituent material of the support member.

5. The thermal electromagnetic wave detection element as set forth in claim 1, wherein each of the surfaces of the pair of vias on the support member side is positioned on a surface of the support member on the semiconductor substrate side.

6. The thermal electromagnetic wave detection element as set forth in claim 1, wherein the detection unit has a pair of electrode wirings for electrically connecting together the pair of electrodes and the pair of vias, and
   the pair of electrode wirings each perforate through the support member and are electrically connected to the pair of vias.

7. The thermal electromagnetic wave detection element as set forth in claim 1, wherein the pair of vias are each provided perforating through the support member.

8. The thermal electromagnetic wave detection element as set forth in claim 1, wherein the void is formed by subjecting the semiconductor substrate to an etching process, and
   the etching rate of a constituent material of the semiconductor substrate in the etching process is at least tenfold the etching rate of a constituent material of the support member.

9. The thermal electromagnetic wave detection element as set forth in claim 1, wherein the void is formed by subjecting the semiconductor substrate to an etching process, and
   the etching rate of a constituent material of the semiconductor substrate in the etching process is tenfold to 100-fold the etching rate of a constituent material of the support member.

10. The thermal electromagnetic wave detection element as set forth in claim 1, wherein the void is formed by subjecting the semiconductor substrate to an etching process, and
    the etching rate of a constituent material of the semiconductor substrate in the etching process is 20-fold to 100-fold the etching rate of a constituent material of the support member.

11. The thermal electromagnetic wave detection element as set forth in claim 1, wherein the height of the void is 1 to 100 μm.

12. The thermal electromagnetic wave detection element as set forth in claim 1, wherein the height of the void is 1 to 20 μm.

13. The thermal electromagnetic wave detection element as set forth in claim 1, wherein the length of the support member is 20 to 50 μm.

14. The thermal electromagnetic wave detection element as set forth in claim 1, wherein the length of the support member is 1 to 10 μm.

15. A method for producing a thermal electromagnetic wave detection device, the method comprising:

obtaining a laminate including a semiconductor substrate, a support member provided on the semiconductor substrate and disposed in a first direction relative to the semiconductor substrate, and a detection unit that is provided on the support member and is configured to extract from a pair of electrodes an electrical signal corresponding to a received amount of electromagnetic waves;

forming a pair of electrically conductive vias that perforate through the semiconductor substrate and are electrically connected to the pair of electrodes, each of the vias having a traverse cross-sectional surface area that gradually decreases as approaching to the support member in the first direction; and subjecting the semiconductor substrate to an etching process and forming a void that opens on the support member side between the pair of vias of the semiconductor substrate.

16. A method for producing a thermal electromagnetic wave detection device, the method comprising:

a obtaining a laminate having a semiconductor substrate and a support member that is provided on the semiconductor substrate and disposed in a first direction relative to the semiconductor substrate;

forming a pair of electrically conductive vias that perforate through the semiconductor substrate, each of the vias having a traverse cross-sectional surface area that gradually decreases as approaching to the support member in the first direction;

forming, on the support member, a detection unit that has a pair of electrodes electrically connected to the pair of vias and is able to extract from the pair of electrodes an electrical signal corresponding to a received amount of electromagnetic waves; and subjecting the semiconductor substrate to an etching process and forming a void that opens on the support member side between the pair of vias of the semiconductor substrate.

17. A method for producing the thermal electromagnetic wave detection element set forth in claim 15, wherein the etching rate of a constituent material of the semiconductor substrate in the etching process is 20-fold to 100-fold the etching rate of a constituent material of the support member.

18. A thermal electromagnetic wave detection device, wherein
a plurality of the thermal electromagnetic wave detection elements set forth in claim 1 are arranged.

19. An electronic apparatus, comprising:
at least one of the thermal electromagnetic wave detection elements set forth in claim 1.

20. The electronic apparatus as set forth in claim 19, wherein the electronic apparatus is an image-capturing device provided with a thermal electromagnetic wave detection device in which a plurality of the thermal electromagnetic wave detection elements set forth in claim 1 are arranged.

* * * * *